United States Patent
Miyamoto

(10) Patent No.: US 7,564,730 B2
(45) Date of Patent: Jul. 21, 2009

(54) MEMORY

(76) Inventor: Hideaki Miyamoto, 310-20, Arakawa-cho, Ogaki-shi, Gifu (JP) 503-0993

( * ) Notice: Subject to any disclaimer, the term of this patent is extended or adjusted under 35 U.S.C. 154(b) by 220 days.

(21) Appl. No.: 11/760,383

(22) Filed: Jun. 8, 2007

(65) Prior Publication Data
US 2007/0297259 A1    Dec. 27, 2007

(30) Foreign Application Priority Data
Jun. 16, 2006   (JP) ............... 2006-166768
Sep. 15, 2006   (JP) ............... 2006-250483

(51) Int. Cl.
    *G11C 7/00*    (2006.01)
(52) U.S. Cl. .............. 365/222; 365/189.04; 365/233.12
(58) Field of Classification Search ................ 365/222, 365/189.04, 233.12
    See application file for complete search history.

(56) References Cited
U.S. PATENT DOCUMENTS
4,829,484 A    5/1989   Arimoto et al.
5,881,010 A *  3/1999   Artieri ................ 365/222
6,646,944 B2  11/2003   Shimano et al.
6,868,027 B2   3/2005   Kawaguchi
7,245,545 B2   7/2007   Miyamoto FOREIGN PATENT DOCUMENTS
| JP | 63-247997   | 10/1988 |
| JP | 7-073682    | 3/1995  |
| JP | 2001-229674 | 8/2001  |
| JP | 2003-123470 | 4/2003  |
| JP | 2004-199842 | 7/2004  |
| JP | 2006-092640 | 4/2006  |
| JP | 2006-250483 | 4/2008  |

* cited by examiner

*Primary Examiner*—Son Dinh
*Assistant Examiner*—Nam Nguyen
(74) *Attorney, Agent, or Firm*—Schwabe, Williamson & Wyatt, P.C.

(57) ABSTRACT

A memory includes an access control portion performing an internal access operation on the basis of an external access operation, a refresh control portion performing a refresh operation, a refresh division control portion dividing the refresh operation into a read operation and a rewrite operation and an address determination portion determining whether or not an address to be subjected to the refresh operation and an address to be subjected to the external access operation during the refresh operation coincide with each other.

20 Claims, 7 Drawing Sheets

MEMORY

CROSS-REFERENCE TO RELATED APPLICATIONS

The priority application numbers JP2006-166768, Memory, Jun. 16, 2006, Hideaki Miyamoto, JP2006-250483, Memory, Sep. 15, 2006, Hideaki Miyamoto, upon which this patent application is based are hereby incorporated by reference.

BACKGROUND OF THE INVENTION

1. Field of the Invention

The present invention relates to a memory, and more particularly, it relates to a memory refreshing stored data.

2. Description of the Background Art

A ferroelectric memory (FeRAM: ferroelectric random-access memory) is generally known as an exemplary nonvolatile memory. The ferroelectric memory utilizes pseudo-capacitance change responsive to the direction of polarization of a ferroelectric substance as a memory element. Simple matrix and one-transistor ferroelectric memories causing disturbance of data stored in memory cells are known as such ferroelectric memories. In other words, it is known that each of the simple matrix and one-transistor ferroelectric memories causes the so-called disturbance in which data are lost due to reduced quantities of polarization of ferroelectric capacitors resulting from application of a prescribed voltage to memory cells connected to word lines other than a selected word line in a rewrite operation after a read operation and a write operation on memory cells including ferroelectric capacitors. In order to suppress such disturbance, each of the simple matrix and one-transistor ferroelectric memories performs a refresh operation.

In relation to a memory performing a refresh operation, various techniques have been proposed in order to perform the refresh operation uncompetitively with an internal access operation. For example, there is proposed a DRAM (dynamic random-access memory) performing an internal access operation (read or write operation) in synchronization with an internal clock having a shorter cycle than an external clock having a prescribed cycle. In general, a DRAM must perform a refresh operation upon a lapse of a constant period. In this DRAM, the number of internal clocks generated in a constant period is larger than the number of external clocks input in the constant period since the cycle of the internal clock is shorter than that of the external clock. Therefore, the internal clock is periodically generated also when no external access operation is performed in synchronization with the external clock, to result in periodic generation of an internal clock irrelevant to an internal access operation corresponding to an external access operation. The DRAM is so formed as to perform a refresh operation consisting of a read operation and a rewrite operation in synchronization with this internal clock irrelevant to an internal access operation. Thus, the DRAM can perform the refresh operation without hindering any internal access operation.

However, the conventional DRAM performs the refresh operation by continuously performing the read operation and the rewrite operation in synchronization with the internal clock having the cycle shorter by a prescribed ratio than that of the external clock, and hence the cycle of the internal clock is disadvantageously increased. Thus, the cycle of the external clock longer than that of the internal clock must also be increased, to disadvantageously result in a long period of the external access operation.

SUMMARY OF THE INVENTION

A memory according to an aspect of the present invention comprises an access control portion performing an internal access operation on the basis of an external access operation, a refresh control portion performing a refresh operation, a refresh division control portion dividing the refresh operation into a read operation and a rewrite operation and an address determination portion determining whether or not an address to be subjected to the refresh operation and an address to be subjected to the external access operation during the refresh operation coincide with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

The structure of a simple matrix ferroelectric memory according to a first embodiment of the present invention will be now described with reference to FIGS. 1 to 3. The first embodiment is described with reference to a simple matrix ferroelectric memory having memory cells formed by only single ferroelectric capacitors arranged on the intersectional positions between corresponding word lines and corresponding bit lines respectively.

Figure 1:
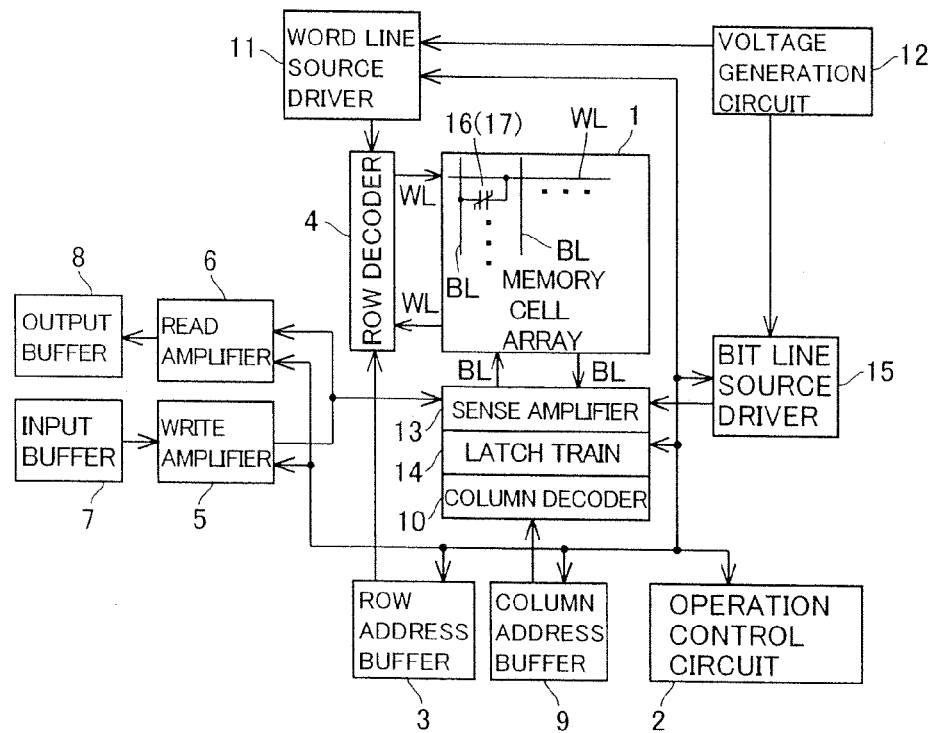
FIG. 1 is a block diagram showing the overall structure of a simple matrix ferroelectric memory according to a first embodiment of the present invention.

The simple matrix ferroelectric memory according to the first embodiment comprises a memory cell array 1, an operation control circuit 2, a row address buffer 3, a row decoder 4, a write amplifier 5, a read amplifier 6, an input buffer 7, an output buffer 8, a column address buffer 9, a column decoder 10, a word line source driver 11, a voltage generation circuit 12, a sense amplifier 13, a latch train 14 and a bit line source driver 15 as shown in FIG. 1. The latch train 14 is an example of the "latch portion" in the present invention.

Figure 2:
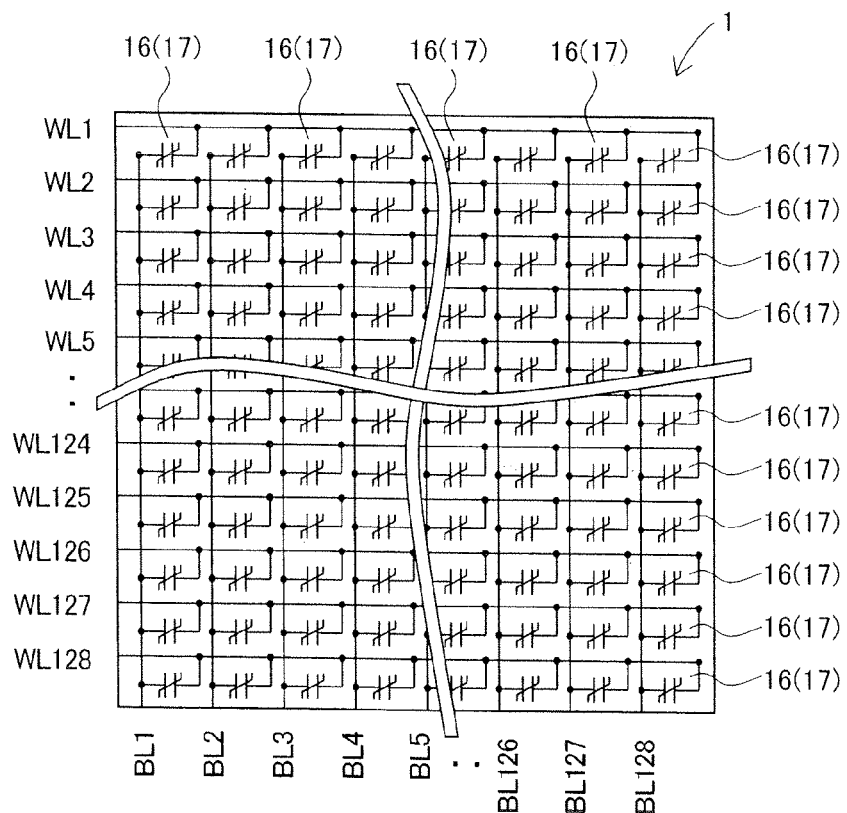
FIG. 2 is a schematic diagram for illustrating the structure of a memory cell array of the simple matrix ferroelectric memory according to the first embodiment shown in FIG. 1.

As shown in FIG. 2, 128 word lines WL and 128 bit lines BL, for example, are arranged on the memory cell array 1 to intersect with each other, while memory cells 17 formed by only single ferroelectric capacitors 16 are arranged on the intersectional positions between the word lines WL and the bit lines BL in the form of a matrix. The ferroelectric capacitors 16 include the corresponding word lines WL, the corresponding bit lines BL and ferroelectric films (not shown) arranged between the word lines WL and the bit lines BL. The row decoder 4 is connected to the word lines WL, and the row address buffer 3 is connected to the row decoder 4.

According to the first embodiment, the operation control circuit 2 is provided for controlling internal access operations and refresh operations for data of the memory cells 17. As shown in FIG. 3, the operation control circuit 2 includes an external access detection circuit 20, an access counter circuit (counter) 21, a refresh control circuit 22, a refresh division control circuit 23, an address determination circuit 24 and an access control circuit 26 having an internal clock generation circuit 25. The external access detection circuit 20, the access counter circuit 21 and the internal clock generation circuit 25 are examples of the "external access detection portion", the "external access counter portion", and the "internal clock generation portion" in the present invention respectively. The refresh control circuit 22 is examples of the "refresh control portion" and the "refresh control means" in the present invention, and the refresh division control circuit 23 is the "refresh division control portion" and the "refresh division control means" in the present invention. The address determination circuit 24 is examples of the "address determination portion" and the "address determination means" in the present invention, and the access control circuit 26 is examples of the "access control portion" and the "access control means" in the present invention.

The external access detection circuit 20 has a function of outputting an external access detection pulse CMD to the access counter circuit (counter) 21 and the access control circuit 26 when receiving an external clock ECLK through an external access operation. The external access detection circuit 20 also receives a command including an external address signal corresponding to an internal address signal for an internal access operation. The external access detection circuit 20 has a function of determining which operation the external access operation is, a read operation or a write operation. The access counter circuit 21, reset upon power supply, has a function of counting up an external access frequency by +1 every time the same receives the external access detection pulse CMD from the external access detection circuit 20 and outputting the resulting external access frequency to the refresh control circuit 22.

The refresh control circuit 22 has a function of outputting a refresh request signal to the access control circuit 26 in order to request a refresh operation of the memory cell array 1 when the external access frequency reaches a constant frequency ($10^6$ times, for example). The refresh control circuit 22 also has a function of outputting a refresh address signal for a refresh operation to the row address buffer 3 when receiving a refresh signal from the access control circuit 26. The refresh control circuit 22 further has a function of outputting a latch signal requesting first and second rewrite operations RFRS1 and RFRS2 to the latch train 14. The access control circuit 26 has a function of outputting a sense amplifier activation signal for activating the sense amplifier 13 to the sense amplifier 13. The refresh division control circuit 23 has a function of dividing the refresh operation into a read operation RFRD, the first rewrite operation RFRS1 and the second rewrite operation RFRS2 and outputting a division signal requesting any of these operations to the refresh control circuit 22.

According to the first embodiment, the address determination circuit 24 has a function of determining whether or not a row address corresponding to the word line WL to be subjected to the refresh operation and a row address corresponding to the word line WL to be subjected to the external access operation performed during the refresh operation coincide with each other. More specifically, the address determination circuit 24 outputs an address determination signal AEQF of a high level to the refresh control circuit 22 when determining that the row address corresponding to the word line WL to be subjected to the refresh operation and the row address corresponding to the word line WL to be subjected to the external access operation performed during the refresh operation coincide with each other. When the address determination signal AEQF of a high level is supplied from the address determination circuit 24 to the refresh control circuit 22, the refresh control circuit 22 counts up the refresh address signal by +1 without the first and second rewrite operations RFRS1 and RFRS2.

The access control circuit 26 also has a function of generating an internal clock ICLK1 for an internal access operation with the internal clock generation circuit 25 when receiving the external access detection pulse CMD from the external access detection circuit 20. The access control circuit 26 further has a function of generating another internal clock ICLK2 for the divided refresh operation with the internal clock generation circuit 25 when performing the refresh operation after termination of the internal access operation. The cycle (50 nsec., for example) of the external clock ECLK is set to be longer than the cycle (30 nsec., for example) of the internal clock ICLK1 and the cycle (10 nsec., for example) of the internal clock ICLK2. The cycle of the internal clock ICLK1 is at least in excess of a time for completing the internal access operation. The cycle of the internal clock ICLK2 is set to about ⅓ of the cycle of the internal clock ICLK1. The access control circuit 26 further has a function of generating an internal access operation signal for the internal access operation and outputting this internal access operation signal to the read amplifier 6 and the write amplifier 5. The access control circuit 26 further has a function of outputting a row address signal and a column address signal of the internal address signal for the internal access operation to the row address buffer 3 and the column address buffer 9 respectively. The access control circuit 26 further has a function of outputting a refresh signal to the refresh control circuit 22 when supplied with the refresh request signal from the refresh control circuit 22 upon termination of the internal access operation.

The row address buffer 3 is provided for supplying a prescribed row address signal corresponding to the row address signal of the internal address signal transmitted from the access control circuit 26 and the refresh address signal transmitted from the refresh control circuit 22 to the row decoder 4. The row decoder 4 is so formed as to activate the word line WL corresponding to the prescribed row address signal supplied from the row address buffer 3 in the internal access operation and the refresh operation. The row address buffer 3 includes a switching circuit 31. The switching circuit 31 is an example of the "switching portion" in the present invention. Thus, the row address buffer 3 is enabled to switch a row address signal corresponding to the internal address signal for the internal access operation and another row address signal corresponding to the refresh address signal for the refresh operation and supply the same to the row decoder 4.

As shown in FIG. 1, the input buffer 7 and the output buffer 8 are connected to the write amplifier 5 and the read amplifier 6 respectively. The column decoder 10 is connected to the column address buffer 9. The word line source driver 11 is connected to the row decoder 4. The voltage generation circuit 12 and the operation control circuit 2 are connected to the word line source driver 11. The column decoder 10 is connected to the bit lines BL of the memory cell array 1 through the sense amplifier 13. The write amplifier 5, the read amplifier 6 and the bit line source driver 15 are connected to the sense amplifier 13, while the voltage generation circuit 12 is connected to the bit line source driver 15.

Operations of the simple matrix ferroelectric memory according to the first embodiment of the present invention will be now described with reference to FIGS. 1 to 7. In the following description, it is assumed that the external access frequency counted by the access counter circuit 21 has reached the prescribed frequency ($10^6$ times, for example) allowing suppression of data disturbance by refreshment in an external access operation preceding an external access operation A shown in FIG. 4 and the refresh control circuit 22 outputs a refresh request signal to the access control circuit 26.

Figure 3:
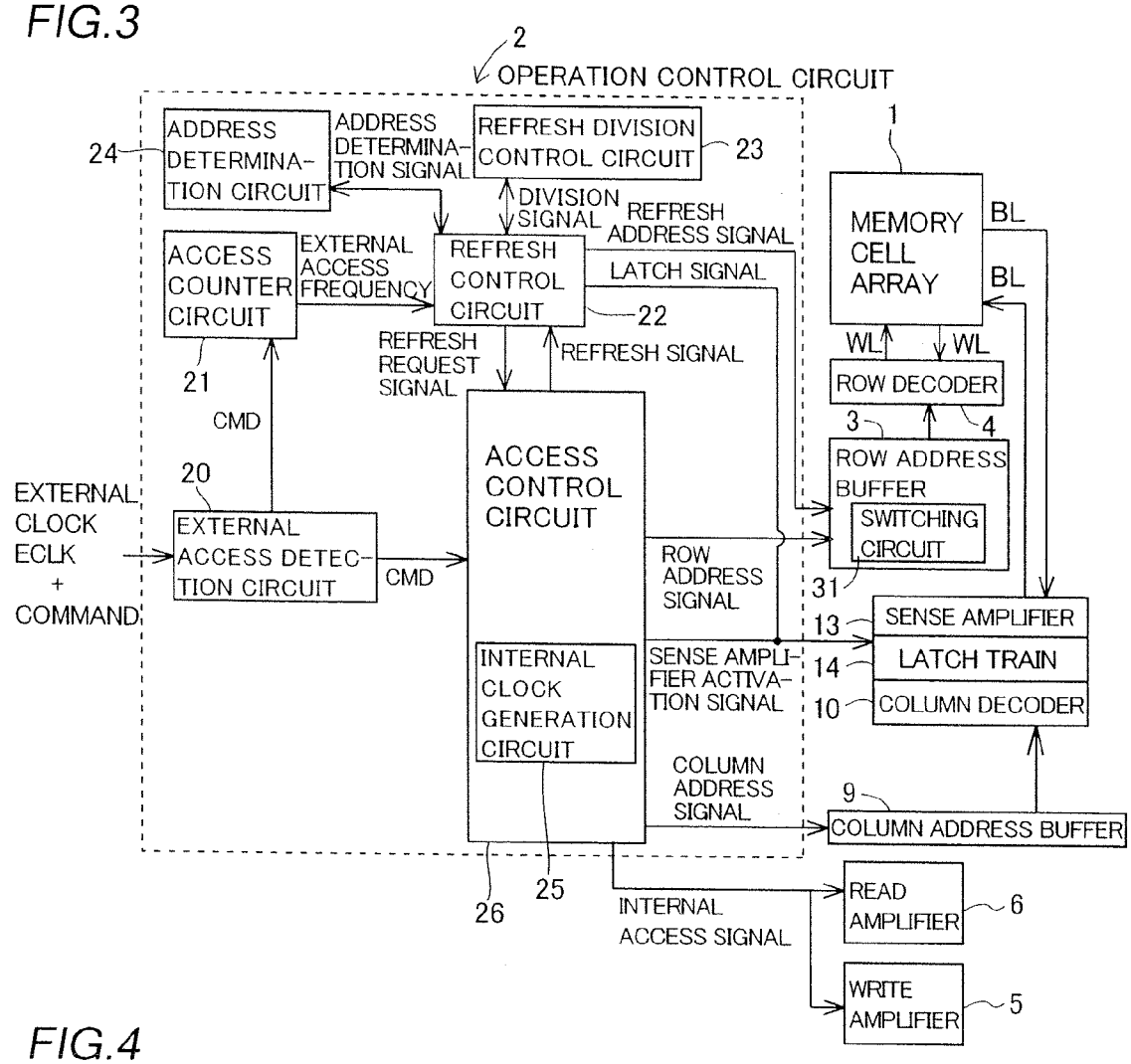
FIG. 3 is a block diagram for illustrating the structure of an operation control circuit of the simple matrix ferroelectric memory according to the first embodiment shown in FIG. 1.
Figure 4:
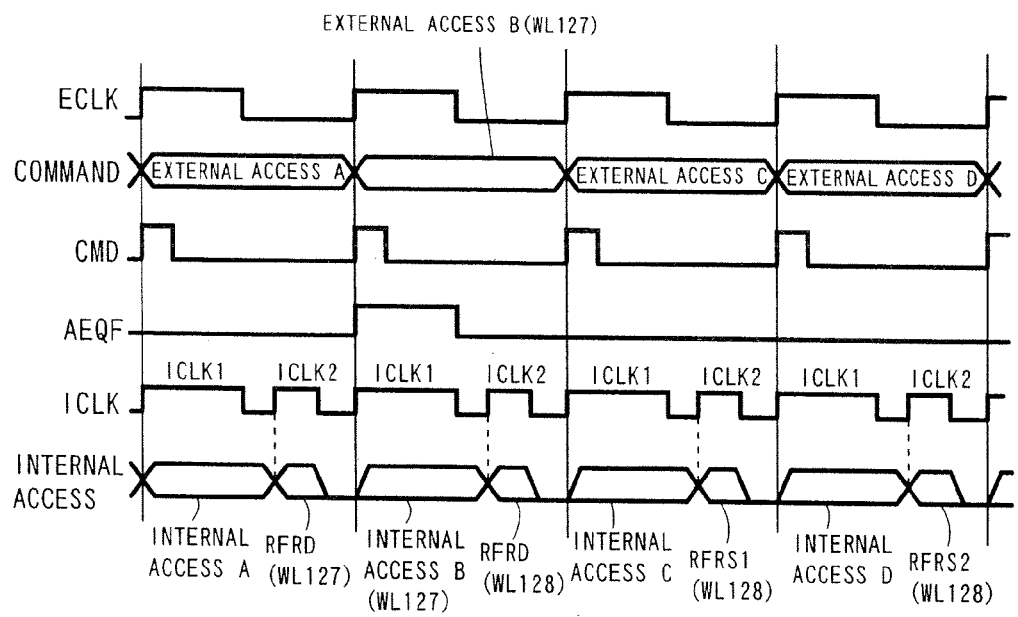
FIG. 4 is a voltage waveform diagram for illustrating operations of the simple matrix ferroelectric memory according to the first embodiment of the present invention.

When detecting an external clock ECLK for the external access operation A, the external access detection circuit 20 generates an external access detection pulse CMD and supplies this external access detection pulse CMD to the access counter circuit 21 and the access control circuit 26, as shown in FIGS. 3 and 4. When supplied with the external access detection pulse CMD upon detection of the external access operation A, the access counter circuit 21 counts up the external access frequency by +1 and supplies data of the resulting external access frequency to the refresh control circuit 22.

When supplied with the external access detection pulse CMD upon detection of the external access operation A, the access control circuit 26 generates an internal clock ICLK1 having the cycle (30 nsec., for example) shorter than the period (60 nsec., for example) of the external access operation A with the internal clock generation circuit 25. Then, the access control circuit 26 performs an internal access operation A in this cycle of the internal clock ICLK1.

In this internal access operation, the access control circuit 26 supplies a row address signal of an internal address signal to the row address buffer 3, which in turn supplies the received row address signal of the internal address signal to the row decoder 4. In the internal access operation, further, the access control circuit 26 supplies a column address signal of the internal address signal to the column address buffer 9, which in turn supplies the received column address signal of the internal address signal to the column decoder 10.

Figure 5:
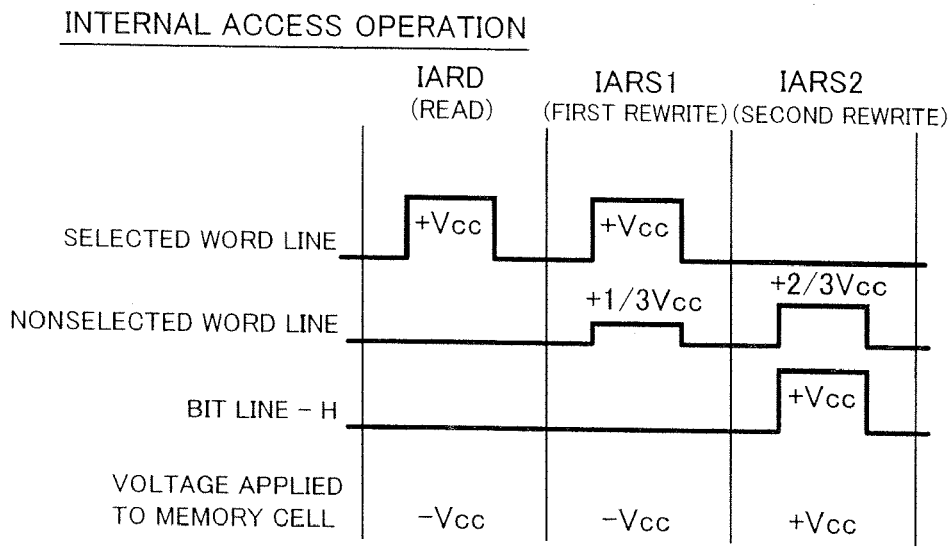
FIGS. 5 and 6 are voltage waveform diagrams for illustrating an internal access operation of the simple matrix ferroelectric memory according to the first embodiment of the present invention.
Figure 6:
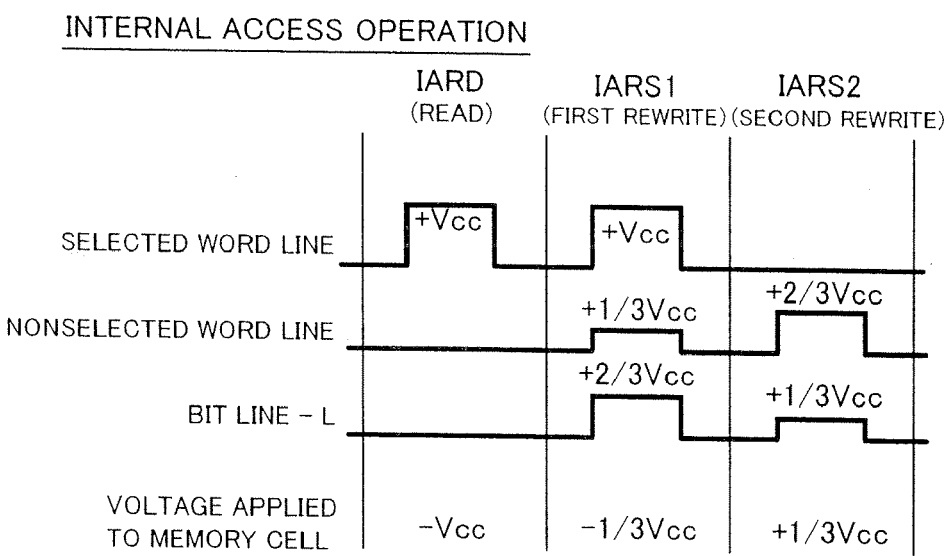

When the internal access operation is a read operation, the ferroelectric memory continuously performs three cycles formed by a divided read operation IARD, a first rewrite operation IARS1 and a second rewrite operation IARS2, as shown in FIGS. 5 and 6. More specifically, the ferroelectric memory applies a voltage +Vcc to a selected word line WL corresponding to the row address signal of the internal address signal while applying no voltage to the bit lines BL thereby collectively reading data stored in all memory cells 17 (see FIG. 2) linked to the selected word line WL through the corresponding bit lines BL with the sense amplifier 13, as shown in FIGS. 5 and 6.

Then, the ferroelectric memory applies the voltage +Vcc to the memory cells 17, from which data "H" have been read, among those linked to the selected word line WL while applying no voltage to the bit lines BL thereby writing data "L" in these memory cells 17 in the first rewrite operation IARS1, as shown in FIG. 5. Thereafter the ferroelectric memory applies the voltage +Vcc to the bit lines BL from which data "H" have been read while applying no voltage to the selected word line WL thereby writing data "H" in the memory cells 17 in the second rewrite operation IARS2. In the first rewrite operation IARS1 on the memory cells 17 from which data "H" have been read, the ferroelectric memory applies a voltage +⅓Vcc to nonselected word lines WL while applying no voltage to the bit lines BL from which data "H" have been read. Thus, the ferroelectric memory applies a voltage −⅓Vcc to the memory cells 17 connected to the nonselected word lines WL and the bit lines BL from which data "H" have been read in the first rewrite operation IARS1. In the second rewrite operation IARS2, the ferroelectric memory applies a voltage +⅔Vcc to the nonselected word lines WL while applying the voltage +Vcc to the bit lines BL from which data "H" have been read. Thus, the ferroelectric memory applies the voltage +⅓Vcc to the memory cells 17 connected to the nonselected word lines WL and the bit lines BL from which data "H" have been read in the second rewrite operation IARS2. Therefore, the ferroelectric memory applies no voltage exceeding ⅓Vcc to the memory cells 17 connected to the nonselected word lines WL and the bit lines BL from which data "H" have been read as an absolute value, while applying the voltages −⅓Vcc and +⅓Vcc generated in the first and second rewrite operations IARS1 and IARS2 respectively to cancel each other.

On the other hand, the ferroelectric memory has read data from and written data "L" in the memory cells 17 from which data "L" have been read among those linked to the selected word line WL through the aforementioned read operation IARD, as shown in FIG. 6. Therefore, the ferroelectric memory so performs the first and second rewrite operations IARS1 and IARS2 as not to apply a voltage exceeding ⅓Vcc to the memory cells 17 as an absolute value destroying the data "L" written in the memory cells 17. More specifically, the ferroelectric memory applies the voltage +Vcc to the selected word line WL while applying the voltage +⅔Vcc to the bit lines BL from which data "L" have been read in the first rewrite operation IARS1 with respect to the memory cells 17 of the selected word line WL. In the second rewrite operation IARS2, the ferroelectric memory applies no voltage to the selected word line WL while applying the voltage +⅓Vcc to the bit lines BL from which data "L" have been read. In the first rewrite operation IARS1 with respect to the memory cells 17 from which data "L" have been read, the ferroelectric memory applies the voltage +⅓Vcc to the nonselected word lines WL while applying the voltage +⅔Vcc to the bit lines BL from which data "L" have been read. Thus, only the voltage +⅓Vcc appears in the memory cells 17 connected to the nonselected word lines WL and the bit lines BL from which data "L" have been read in the first rewritten operation IARS1. In the second rewrite operation IARS2, the ferroelectric memory applies the voltage +⅔Vcc to the nonselected word lines WL while applying the voltage +⅓Vcc to the bit lines BL from which data "L" have been read. Thus, the ferroelectric memory applies the voltage −⅓Vcc to the memory cells 17 connected to the nonselected word lines WL and the bit lines BL from which data "L" have been read in the second rewrite operation IARS2. Therefore, the ferroelectric memory applies no voltage exceeding ⅓Vcc to the memory cells 17 connected to the nonselected word lines WL and the bit lines BL from which data "L" have been read as an absolute value, while applying the voltages +⅓Vcc and −⅓Vcc generated in the first and second rewrite operations IARS1 and IARS2 respectively to cancel each other.

When terminating the internal access operation A, the access control circuit 26 supplied with the refresh request signal from the refresh control circuit 22 generates an internal clock ICLK2 for performing a refresh operation after the internal access operation A and outputs a refresh signal to the refresh control circuit 22. Consequently, the ferroelectric memory enters a refresh operation state. It is assumed that this is a 127th refresh operation after the supply of the refresh request signal. In other words, it is assumed that the word lines WL1 to WL126 have already been refreshed and the ferroelectric memory refreshes the word line WL127.

Figure 7:
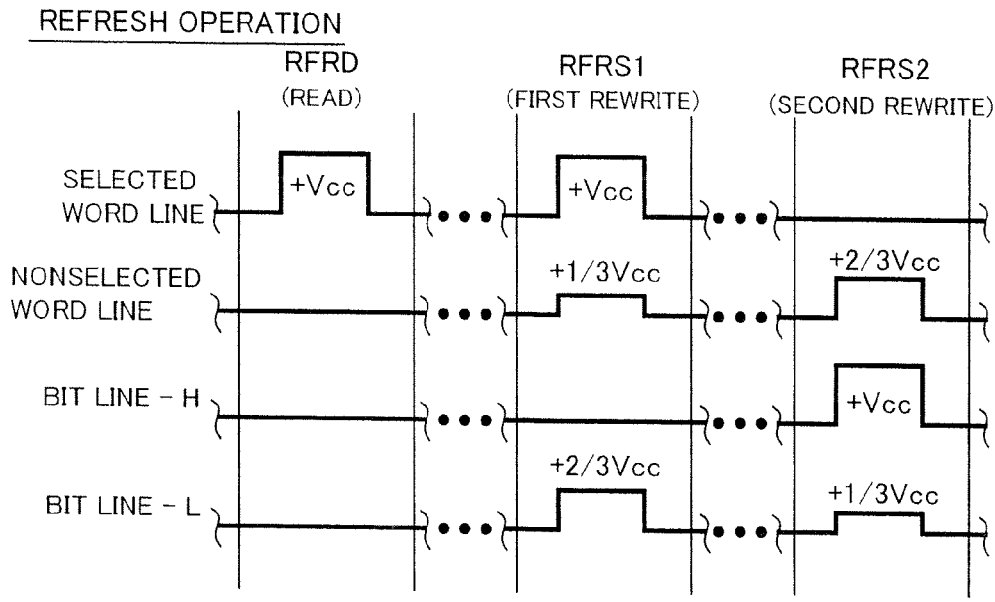
FIG. 7 is a voltage waveform diagram for illustrating a divided refresh operation of the simple matrix ferroelectric memory according to the first embodiment of the present invention.

The refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation with respect to the word lines WL127 to the refresh control circuit 22 supplied with the refresh signal upon termination of the internal access operation A. Therefore, the refresh control circuit 22 outputs a refresh address signal including a row address corresponding to the word line WL127 to the row address buffer 3, in order to perform the read operation RFRD of the refresh operation. In the read operation RFRD of the refresh operation, the ferroelectric memory applies the voltage +Vcc to the word line WL127 while applying no voltage to the bit lines BL, as shown in FIG. 7. Thus, the ferroelectric memory outputs data of the memory cells 17 linked to the word line WL127 to the latch train 14, which in turn holds the received data. Upon termination of the read operation RFRD, the access control circuit 26 enters a standby state up to initiation of a subsequent external access operation B.

When detecting an external clock ECLK for the external access operation B (see FIG. 4), the external access detection circuit 20 generates an external access detection pulse CMD and supplies this external access detection pulse CMD to the access counter circuit 21 and the access control circuit 26. When supplied with the external access detection pulse CMD upon detection of the external access operation B, the access counter circuit 21 counts up the external access frequency by +1 and supplies data of the resulting external access frequency to the refresh control circuit 22. It is assumed that the external access detection circuit 20 has determined that the external access operation B is an operation for writing data in the memory cells 17 linked to the word line WL127.

When supplied with the external access detection pulse CMD upon detection of the external access operation B, the access control circuit 26 generates an internal clock ICLK1 for one cycle with the internal clock generation circuit 25. Then, the access control circuit 26 performs an internal access operation B with respect to the word line WL127 in this cycle of the internal clock ICLK1. Therefore, data of the memory cells 17 linked to the word line WL127 is replaced from data held in the latch train 14 through the read operation RFRD of the refresh operation. When the external access detection circuit 20 determines that the external access operation B is an operation for reading the data of the memory cells 17 linked to the word line WL127, the operation for reading the data of the memory cells 17 linked to the word line WL127 is performed after the data held in the latch train 14 is rewritten in the word line WL127. Thus, also when data "L" is written in the memory cells 17 storing data "H" due to destructive readout through the aforementioned read operation RFRD of the refresh operation with respect to the word line WL127, the data "H" held in the latch train 14 is rewritten in the memory cells 17 corresponding to the word line WL127 before a read operation corresponding to the external access operation B, thereby allowing suppression of readout in a state of replacing the data "H" in the memory cells 17 with the data "L" due to the destructive readout in a read operation corresponding to the external access operation B.

According to the first embodiment, the row address corresponding to the word line WL127 to be subjected to the external access operation B and the row address corresponding to the word line WL127 to be subjected to the read operation RFRD of the refresh operation coincide with each other, whereby the refresh control circuit 22 is supplied with an address determination signal AEQF of a high level from the address determination circuit 24. Thus, the refresh control circuit 22 counts up the refresh address signal by +1 without the first rewrite operation RFRS1. In other words, the refresh operation of the word line WL127 is terminated and is transferred to a refresh operation of the next word line WL128.

When terminating the internal access operation B with respect to the word line WL127, the access control circuit 26 supplied with the refresh request signal from the refresh control circuit 22 generates an internal clock ICLK2 for performing a refresh operation after the internal access operation B and outputs a refresh signal to the refresh control circuit 22. Consequently, the ferroelectric memory enters a refresh operation state.

The refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation with respect to the next word line WL128 to the refresh control circuit 22 supplied with the refresh signal upon termination of the internal access operation B with respect to the word line WL127. Therefore, the refresh control circuit 22 outputs a refresh address signal including a row address corresponding to the word line WL128 to the row address buffer 3, in order to perform the read operation RFRD of the refresh operation. In the read operation RFRD of the refresh operation, the ferroelectric memory applies the voltage +Vcc to the word line WL128 while applying no voltage to the bit lines BL as shown in FIG. 7. Thus, the ferroelectric memory outputs data of the memory cells 17 linked to the word line WL128 to the latch train 14, which in turn holds the received data. Upon termination of the read operation RFRD with respect to the word line WL128, the access control circuit 26 enters a standby state up to initiation of a subsequent external access operation C.

When detecting an external clock ECLK for the external access operation C (see FIG. 4), the external access detection circuit 20 generates an external access detection pulse CMD and supplies this external access detection pulse CMD to the access counter circuit 21 and the access control circuit 26. When supplied with the external access detection pulse CMD upon detection of the external access operation C, the access counter circuit 21 counts up the external access frequency by +1 and supplies data of the resulting external access frequency to the refresh control circuit 22. It is assumed that the external access operation C is an operation for accessing the memory cells 17 linked to the word line WL other than the word line WL128.

When supplied with the external access detection pulse CMD upon detection of the external access operation C, the access control circuit 26 generates an internal clock ICLK1 for one cycle with the internal clock generation circuit 25. Then, the access control circuit 26 performs an internal access operation C in this cycle of the internal clock ICLK1.

According to the first embodiment, the row address corresponding to the word line WL to be subjected to the external access operation C and the row address corresponding to the word line WL128 to be subjected to the read operation RFRD of the refresh operation do not coincide with each other, whereby the refresh control circuit 22 is supplied with an address determination signal AEQF of a low level from the address determination circuit 24. Thus, the refresh operation of the word line WL128 is continued without counting up the refresh address signal.

When terminating the internal access operation C, the access control circuit 26 supplied with the refresh request signal from the refresh control circuit 22 generates an internal clock ICLK2 for performing a refresh operation after termination of the internal access operation C and outputs a refresh signal to the refresh control circuit 22, Consequently, the ferroelectric memory enters a refresh operation state.

The refresh division control circuit 23 outputs a division signal requesting only the first rewrite operation RFRS1 forming the second cycle among the read operation RFRD, the first rewrite operation RFRS1 and the second rewrite operation RFRS2 forming the three cycles of the refresh operation with respect to the word line WL128 to the refresh control circuit 22 supplied with the refresh signal upon termination of the internal access operation C. Therefore, the refresh control circuit 22 outputs a refresh address signal including the row address corresponding to the word line WL128 to the row address buffer 3, in order to perform the first rewrite operation RFRS1 of the refresh operation. In the first rewrite operation RFRS1 of the refresh operation, the ferroelectric memory applies the voltage +Vcc to the word line WL128 while applying no voltage to the bit lines BL from which data "H" have been read and applying the voltage +⅔Vcc to the bit lines BL from which data "L" have been read, as shown in FIG. 7. Upon termination of the first rewrite operation RFRS1 with respect to the word line WL128, the access control circuit 26 enters a standby state up to initiation of a subsequent external access operation D.

When detecting an external clock ECLK for the external access operation D (see FIG. 4), the external access detection circuit 20 generates an external access detection pulse CMD and supplies this external access detection pulse CMD to the access counter circuit 21 and the access control circuit 26. When supplied with the external access detection pulse CMD upon detection of the external access operation D, the access counter circuit 21 counts up the external access frequency by +1 and supplies data of the resulting external access frequency to the refresh control circuit 22. It is assumed that the external access operation D is an operation for accessing the memory cells 17 linked to the word line WL other than the word line WL128.

When supplied with the external access detection pulse CMD upon detection of the external access operation D, the access control circuit 26 generates an internal clock ICLK1 for one cycle with the internal clock generation circuit 25. Then, the access control circuit 26 performs an internal access operation D in this cycle of the internal clock ICLK1.

According to the first embodiment, a row address corresponding to the word line WL to be subjected to the external access operation D and the row address corresponding to the word line WL128 to be subjected to the read operation RFRD of the refresh operation do not coincide with each other, whereby the refresh control circuit 22 is supplied with an address determination signal AEQF of a low level from the address determination circuit 24. Thus, the refresh operation of the word line WL128 is continued without counting up the refresh address signal.

When terminating the internal access operation D, the access control circuit 26 supplied with the refresh request signal from the refresh control circuit 22 generates an internal clock ICLK2 for performing a refresh operation after the internal access operation D and outputs a refresh signal to the refresh control circuit 22. Consequently, the ferroelectric memory enters a refresh operation state.

The refresh division control circuit 23 outputs a division signal requesting only the second rewrite operation RFRS2 forming the third cycle among the read operation RFRD, the first rewrite operation RFRS1 and the second rewrite operation RFRS2 forming the three cycles of the refresh operation with respect to the word line WL128 to the refresh control circuit 22 supplied with the refresh signal upon termination of the internal access operation D. Therefore, the refresh control circuit 22 outputs a refresh address signal including the row address corresponding to the word line WL128 to the row address buffer 3, in order to perform the second rewrite operation RFRS2 of the refresh operation. In the second rewrite operation RFRS2 of the refresh operation, the ferroelectric memory applies the voltage +Vcc to the bit lines BL from which data "H" have been read and applies the voltage +⅓Vcc to the bit lines BL from which data "L" have been read while applying no voltage to the word line WL128, as shown in FIG. 7. Upon termination of the second rewrite operation RFRS2 with respect to the word line WL128, the refresh control circuit 22 steps down the refresh request signal to a low level since the ferroelectric memory has refreshed all of the word lines WL1 to WL128. Thereafter the access control circuit 26 enters a standby state up to initiation of a subsequent external access operation.

Thereafter the ferroelectric memory repeats only the internal access operation without performing the refresh operation. When external access operations are performed by a prescribed frequency ($10^6$ times, for example) from initiation of the refresh operation responsive to the precedent refresh request signal, the refresh control circuit 22 supplies a refresh request signal to the access control circuit 26 on the basis of the external access frequency supplied by the access counter circuit 21. Then, the ferroelectric memory performs a refresh operation divided into three cycles on all word lines WL1 to WL128 again.

According to the first embodiment, as hereinabove described, the ferroelectric memory provided with the refresh division control circuit 23 dividing the refresh operation into the read operation RFRD, the first rewrite operation RFRS1 and the second rewrite operation RFRS2 for performing the read operation RFRD, the first rewrite operation RFRS1 and the second rewrite operation RFRS2 after different internal access operations corresponding to different external access operations respectively can reduce the period of the refresh operation performed in the period of each external access operation as compared with a case of continuously performing the read and write operations of the refresh operation, whereby the period of the external access operation (cycle of the external clock ECLK) can be reduced. Consequently, the ferroelectric memory can improve the data transfer rate.

According to the first embodiment, the ferroelectric memory provided with the latch train 14 for holding data read through the read operation RFRD of the refresh operation without losing the same can restore and rewrite the data held in the latch train 14 in the subsequent first and second rewrite operations RFRS1 and RFRS2 of the refresh operation despite the division of the refresh operation into the read operation RFRD and the first and second rewrite operations RFRS1 and RFRS2. Further, the ferroelectric memory provided with the access counter circuit 21 for performing the refresh operation when the external access operation is performed by a constant frequency smaller than that causing disturbance allows a refresh operation suitable to a simple matrix ferroelectric memory, such as that according to the first embodiment, whose data are deteriorated by a constant frequency of external access operations. In the memory cells 17 connected to the nonselected word lines WL, voltages caused in the first and second rewrite operations IARS1 and IARS2 respectively cancel each other, whereby the ferroelectric memory can suppress data deterioration in the memory cells 17 connected to the nonselected word lines WL through the internal access operation.

According to the first embodiment, the ferroelectric memory is provided with the address determination circuit 24 determining whether or not the row address corresponding to the word line WL to be subjected to the refresh operation and the row address corresponding to the word line WL to be subjected to the external access operation performed during the refresh operation coincide with each other, whereby the refresh control circuit 22 controls operations so as not to perform the first and second rewrite operations RFRS1 and RFRS2 of the refresh operation when the address determination circuit 24 determines that the row address corresponding to the word line WL to be subjected to the refresh operation and the row address corresponding to the word line WL to be subjected to the external access operation performed during the refresh operation coincide with each other. Thus, data written through the write operation of the external access operation can be inhibited from being disadvantageously replaced with precedent old data in the read operation RFRD of the refresh operation through the first and second rewrite operations RFRS1 and RFRS2 of the refresh operation. At this time, power consumption of the refresh operation can be reduced and a period for performing the refresh operation can be reduced by performing no first and second rewrite operations RFRS1 and RFRS2 of the refresh operation.

Second Embodiment

In a second embodiment, a description will be made of an operation for replacing data held in the latch train 14 with data written through an external access operation when a row address corresponding to the word line WL to be subjected to a refresh operation and a row address corresponding to the word line WL to be subjected to the external access operation performed during the refresh operation coincide with each other in the structure of the aforementioned first embodiment with reference to FIGS. 2, 3, 7 and 8. In the description of the second embodiment, it is assumed that an external access frequency counted by the access counter circuit 21 has reached a prescribed frequency ($10^6$ times, for example) allowing suppression of data disturbance by refreshment in an external access operation preceding an external access operation A shown in FIG. 8 and the refresh control circuit 22 outputs a refresh request signal to the access control circuit 26 similarly to the aforementioned first embodiment.

Figure 8:
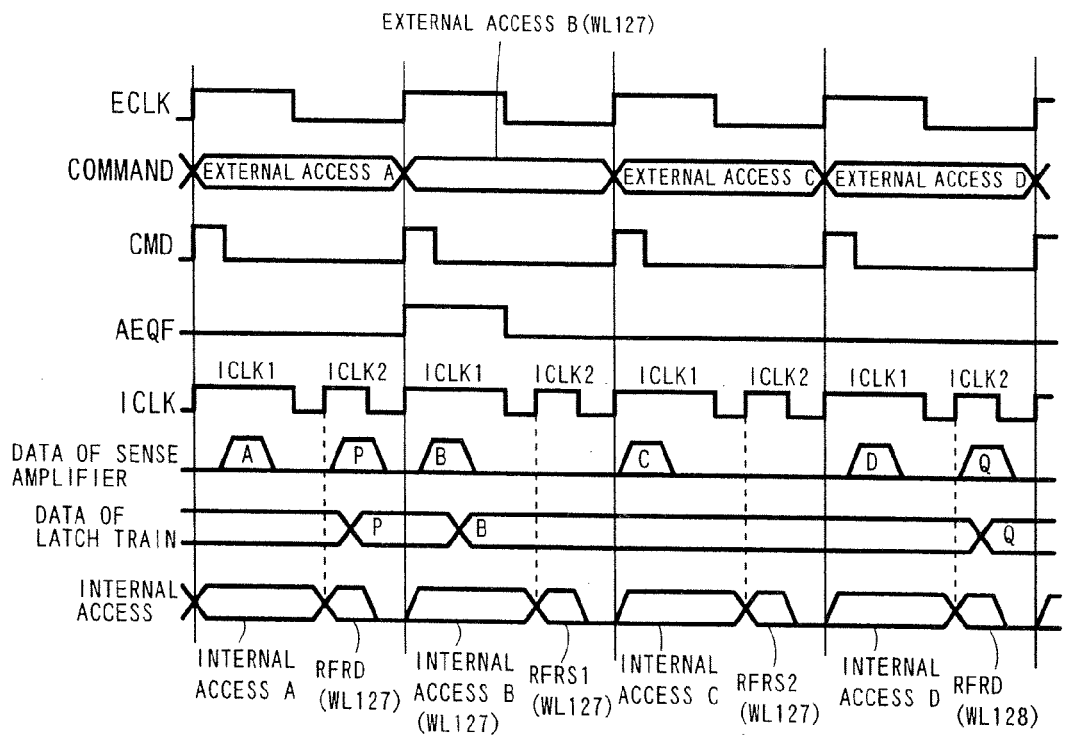
FIG. 8 is a voltage waveform diagram for illustrating operations of a simple matrix ferroelectric memory according to a second embodiment of the present invention.

When detecting an external clock ECLK for the external access operation A, the external access detection circuit 20 generates an external access detection pulse CMD and supplies this external access detection pulse CMD to the access counter circuit 21 and the access control circuit 26, as shown in FIGS. 3 and 8. When supplied with the external access detection pulse CMD upon detection of the external access operation A, the access counter circuit 21 counts up the external access frequency by +1 and supplies data of the resulting external access frequency to the refresh control circuit 22.

When supplied with the external access detection pulse CMD upon detection of the external access operation A, the access control circuit 26 generates an internal clock ICLK1 for one cycle with the internal clock generation circuit 25. Then, the access control circuit 26 performs an internal access operation A in this cycle of the internal clock ICLK1.

When terminating the internal access operation A, the access control circuit 26 supplied with the refresh request signal from the refresh control circuit 22 generates an internal clock ICLK2 for performing a refresh operation after the internal access operation A and outputs a refresh signal to the refresh control circuit 22. Consequently, the ferroelectric memory enters a refresh operation state. It is assumed that this is a 127th refresh operation after the supply of the refresh request signal. In other words, it is assumed that the word lines WL1 to WL126 have already been refreshed and the ferroelectric memory refreshes the word line WL127.

The refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation with respect to the word lines WL127 to the refresh control circuit 22 supplied with the refresh signal upon termination of the internal access operation A. Therefore, the refresh control circuit 22 outputs a refresh address signal including a row address corresponding to the word line WL127 to the row address buffer 3, in order to perform the read operation RFRD of the refresh operation. In the read operation RFRD of the refresh operation, the ferroelectric memory applies a voltage +Vcc to the word line WL127 while applying no voltage to the bit lines BL, as shown in FIG. 7. Thus, the ferroelectric memory outputs data "P" of the memory cells 17 (see FIG. 2) linked to the word line WL127 to the latch train 14, which in turn holds the received data "P". Upon termination of the read operation RFRD with respect to the word line WL127, the access control circuit 26 enters a standby state up to initiation of a subsequent external access operation B.

When detecting an external clock ECLK for the external access operation B (see FIG. 8), the external access detection circuit 20 generates an external access detection pulse CMD and supplies this external access detection pulse CMD to the access counter circuit 21 and the access control circuit 26. When supplied with the external access detection pulse CMD upon detection of the external access operation B, the access counter circuit 21 counts up the external access frequency by +1 and supplies data of the resulting external access frequency to the refresh control circuit 22. It is assumed that the external access detection circuit 20 has determined that the external access operation B is an operation for writing data "B" in the memory cells 17 linked to the word line WL127.

When supplied with the external access detection pulse CMD upon detection of the external access operation B, the access control circuit 26 generates an internal clock ICLK1 for one cycle with the internal clock generation circuit 25. Then, the access control circuit 26 performs an internal access operation B with respect to the word line WL127 in this cycle of the internal clock ICLK1. Therefore, data of the memory cells 17 linked to the word line WL127 is rewritten from the data "P" in the read operation RFRD of the refresh operation to the data "B". When the external access detection circuit 20 determines that the external access operation B is an operation for reading the data of the memory cells 17 linked to the word line WL127, the operation for reading the data "P" of the memory cells 17 linked to the word line WL127 is performed after the data held "P" in the latch train 14 is rewritten in the word line WL127. Thus, also when data "L" is written in the memory cells 17 storing data "H" due to destructive readout through the aforementioned read operation RFRD of the refresh operation with respect to the word line WL127, the data "H" held in the latch train 14 is rewritten in the memory cells 17 corresponding to the word line WL127 before a read operation corresponding to the external access operation B, thereby allowing suppression of readout in a state of replacing the data "H" in the memory cells 17 with the data "L" due to the destructive readout in a read operation corresponding to the external access operation B.

According to the second embodiment, the row address corresponding to the word line WL127 to be subjected to the external access operation B and the row address corresponding to the word line WL127 to be subjected to the read operation RFRD of the refresh operation coincide with each other, whereby the refresh control circuit 22 is supplied with an address determination signal AEQF of a high level from the address determination circuit 24. Thus, the refresh control circuit 22 replaces the data "P" held in the latch train 14 through the read operation RFRD of the refresh operation to the data "B" written through the external access operation B with the access control circuit 26.

When terminating the internal access operation B with respect to the word line WL127, the access control circuit 26 supplied with the refresh request signal from the refresh control circuit 22 generates an internal clock ICLK2 for performing a refresh operation after the internal access operation B and outputs a refresh signal to the refresh control circuit 22. Consequently, the ferroelectric memory enters a refresh operation state.

The refresh division control circuit 23 outputs a division signal requesting only the first rewrite operation RFRS1 forming the second cycle among the read operation RFRD, the first rewrite operation RFRS1 and the second rewrite operation RFRS2 forming the three cycles of the refresh operation with respect to the word line WL127 to the refresh control circuit 22 supplied with the refresh signal upon termination of the internal access operation B with respect to the word line WL127. Therefore, the refresh control circuit 22 outputs a refresh address signal including the row address corresponding to the word line WL127 to the row address buffer 3, in order to perform the first rewrite operation RFRS1 of the refresh operation. In the first rewrite operation RFRS1 of the refresh operation, the ferroelectric memory applies the voltage +Vcc to the word line WL127 while applying no voltage to the bit lines BL from which data "H" have been read and applying a voltage +⅔Vcc to the bit lines BL from which data "L" have been read, as shown in FIG. 7. Upon termination of the first rewrite operation RFRS1 with respect to the word line WL127, the access control circuit 26 enters a standby state up to initiation of a subsequent external access operation C.

When detecting an external clock ECLK for the external access operation C (see FIG. 8), the external access detection circuit 20 generates an external access detection pulse CMD and supplies this external access detection pulse CMD to the access counter circuit 21 and the access control circuit 26. When supplied with the external access detection pulse CMD upon detection of the external access operation C, the access counter circuit 21 counts up the external access frequency by +1 and supplies data of the resulting external access frequency to the refresh control circuit 22. It is assumed that the external access operation C is an operation for accessing the memory cells linked to the word line WL other than the word line WL127.

When supplied with the external access detection pulse CMD upon detection of the external access operation C, the access control circuit 26 generates an internal clock ICLK1 for one cycle with the internal clock generation circuit 25. Then, the access control circuit 26 performs an internal access operation C in this cycle of the internal clock ICLK1.

According to the second embodiment, a row address corresponding to the word line WL to be subjected to the external access operation C and the row address corresponding to the word line WL127 to be subjected to the read operation RFRD of the refresh operation do not coincide with each other, whereby the refresh control circuit 22 is supplied with an address determination signal AEQF of a low level from the address determination circuit 24. Thus, the refresh control circuit 22 does not replace the data "B" held in the latch train 14 with the access control circuit 26.

When terminating the internal access operation C, the access control circuit 26 supplied with the refresh request signal from the refresh control circuit 22 generates an internal clock ICLK2 for performing a refresh operation after termination of the internal access operation C and outputs a refresh signal to the refresh control circuit 22. Consequently, the ferroelectric memory enters a refresh operation state.

The refresh division control circuit 23 outputs a division signal requesting only the second rewrite operation RFRS2 forming the third cycle among the read operation RFRD, the first rewrite operation RFRS1 and the second rewrite operation RFRS2 forming the three cycles of the refresh operation with respect to the word line WL127 to the refresh control circuit 22 supplied with the refresh signal upon termination of the internal access operation C. Therefore, the refresh control circuit 22 outputs a refresh address signal including the row address corresponding to the word line WL127 to the row address buffer 3, in order to perform the second rewrite operation RFRS2 of the refresh operation. In the second rewrite operation RFRS2 of the refresh operation, the ferroelectric memory applies the voltage +Vcc to the bit lines BL from which data "H" have been read and applies a voltage +⅓Vcc to the bit lines BL from which data "L" have been read while applying no voltage to the word line WL127, as shown in FIG. 7. Upon termination of the second rewrite operation RFRS2 with respect to the word line WL127, the access control circuit 26 counts up the refresh address signal by +1 and then enters a standby state up to initiation of a subsequent external access operation D.

When detecting an external clock ECLK for the external access operation D, the external access detection circuit 20 generates an external access detection pulse CMD and supplies this external access detection pulse CMD to the access counter circuit 21 and the access control circuit 26. When supplied with the external access detection pulse CMD upon detection of the external access operation D, the access counter circuit 21 counts up the external access frequency by +1 and supplies data of the resulting external access frequency to the refresh control circuit 22.

When supplied with the external access detection pulse CMD upon detection of the external access operation D, the access control circuit 26 generates an internal clock ICLK1 for one cycle with the internal clock generation circuit 25.

Then, the access control circuit 26 performs an internal access operation D in this cycle of the internal clock ICLK1.

When terminating the internal access operation D, the access control circuit 26 supplied with the refresh request signal from the refresh control circuit 22 generates an internal clock ICLK2 for performing a refresh operation after the internal access operation D and outputs a refresh signal to the refresh control circuit 22. Consequently, the ferroelectric memory enters a refresh operation state.

The refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation with respect to the word line WL128 to the refresh control circuit 22 supplied with the refresh signal upon termination of the internal access operation D. Therefore, the refresh control circuit 22 outputs a refresh address signal including a row address corresponding to the word line WL128 to the row address buffer 3, in order to perform the read operation RFRD of the refresh operation. In the read operation RFRD of the refresh operation, the ferroelectric memory applies the voltage +Vcc to the word line WL127 while applying no voltage to the bit lines BL, as shown in FIG. 7. Thus, the ferroelectric memory outputs data "Q" of the memory cells 17 linked to the word line WL128 to the latch train 14, which in turn holds the received data "Q". Upon termination of the read operation RFRD with respect to the word line WL128, the access control circuit 26 enters a standby state up to initiation of a subsequent external access operation.

First and second rewrite operations RFRS1 and RFRS2 of the refresh operation with respect to the word line WL128 will be hereinafter performed through operations similar to the aforementioned operations. The ferroelectric memory terminates the refresh operation by refreshing all word lines WL1 to WL128. Thereafter the ferroelectric memory repeats only the internal access operation. When external access operations are performed by a prescribed frequency ($10^6$ times, for example) from initiation of the refresh operation responsive to the precedent refresh request signal, the refresh control circuit 22 supplies a refresh request signal to the access control circuit 26 on the basis of the external access frequency supplied by the access counter circuit 21. Then, the ferroelectric memory performs a refresh operation divided into three cycles on all word lines WL1 to WL128 again.

The effects of the second embodiment are similar to those of the aforementioned first embodiment.

Third Embodiment

Figure 9:
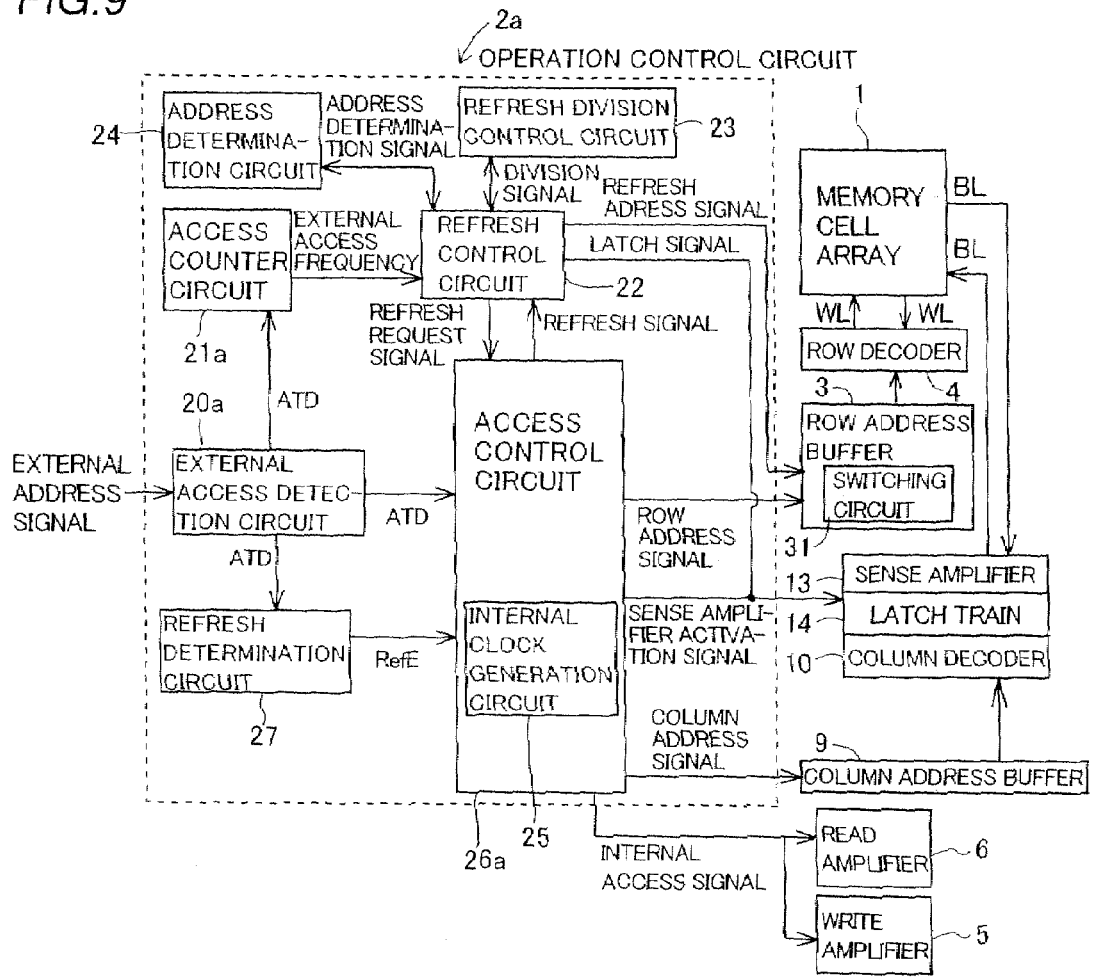
FIG. 9 is a block diagram for illustrating the structure of an operation control circuit of a simple matrix ferroelectric memory according to a third embodiment of the present invention.

Referring to FIG. 9, a third embodiment of the present invention is applied to a simple matrix ferroelectric memory subjected to aperiodic external access operations, dissimilarly to the aforementioned first embodiment.

In the ferroelectric memory according to the third embodiment, an operation control circuit 2a includes an external access detection circuit 20a, an access counter circuit (counter) 21a, a refresh control circuit 22, a refresh division control circuit 23, an address determination circuit 24, an access control circuit 26a having an internal clock generation circuit 25 and a refresh determination circuit 27, as shown in FIG. 9. The external access detection circuit 20a, the access counter circuit 21a and the refresh determination circuit 27 are examples of the "external access determination portion", the "external access counter portion" and the "refresh determination portion" in the present invention respectively. The access control circuit 26a is an example of the "access control portion" and "access control means" in the present invention.

The external access detection circuit 20a has a function of outputting an external access detection pulse ATD to the access counter circuit 21a, the access control circuit 26a and the refresh determination circuit 27 when supplied with an external address signal for an external access operation. The external access detection circuit 20a has a function of determining which operation is the external access operation is, a read operation or a write operation. The access counter circuit 21a, reset upon power supply, has a function of counting up an external access frequency by +1 every time the same receives the external access detection pulse ATD from the external access detection circuit 20a and outputting the resulting external access frequency to the refresh control circuit 22.

The access control circuit 26a has a function of generating an internal clock ICLK1 with the internal clock generation circuit 25 when receiving the external access detection pulse ATD from the external access detection circuit 20a. The access control circuit 26a also has a function of generating another internal clock ICLK2 for a refresh operation with the internal clock generation circuit 25 when receiving a refresh request signal from the refresh control circuit 22 and a refresh determination signal RefE from the refresh determination circuit 27 for performing a refresh operation after termination of an internal access operation. As to the remaining functions, the access control circuit 26a is similar to the access control circuit 26 according to the first embodiment.

When supplied with the external access detection pulse ATD from the external access detection circuit 20a upon detection of the corresponding external access operation, the refresh determination circuit 27 outputs the refresh determination signal RefE of a high or low level on the basis of the operating state of the access control circuit 26a. The refresh control circuit 22, the refresh division control circuit 23 and the address determination circuit 24 are similar in structure to those of the first embodiment. The period (70 nsec., for example) of the shortest cycle of an external address operation is set to be longer than the cycles (60 nsec. and 20 nsec., for example) of the internal clocks ICLK1 and ICLK2.

The remaining structure of the third embodiment is similar to that of the aforementioned first embodiment.

Operations of the simple matrix ferroelectric memory according to the third embodiment of the present invention will be now described with reference to FIGS. 2, 9 and 10. In the following description, it is assumed that the external access frequency counted by the access counter circuit 21a has reached a prescribed frequency ($10^6$ times, for example) allowing suppression of data disturbance by refreshment in an external access operation preceding an external access operation A shown in FIG. 10 and the refresh control circuit 22 outputs a refresh request signal to the access control circuit 26a.

Figure 10:
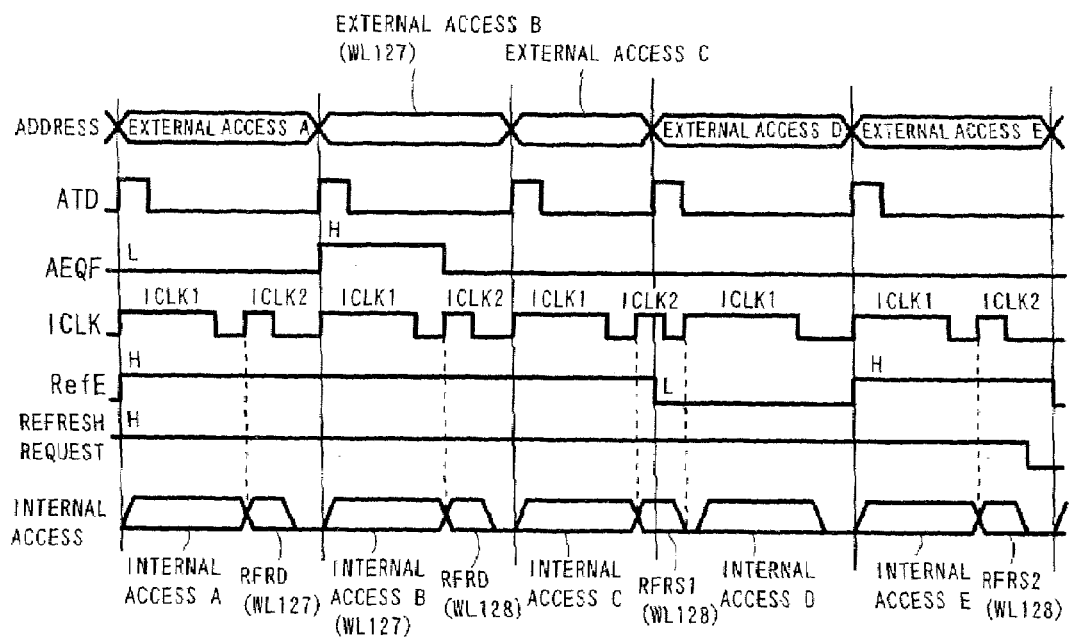
FIG. 10 is a voltage waveform diagram for illustrating operations of the simple matrix ferroelectric memory according to the third embodiment of the present invention.

When detecting an external address signal for the external access operation A, the external access detection circuit 20a generates an external access detection pulse ATD and supplies this external access detection pulse ATD to the access counter circuit 21a, the access control circuit 26a and the refresh determination circuit 27, as shown in FIGS. 9 and 10. When supplied with the external access detection pulse ATD upon detection of the external access operation A, the access counter circuit 21a counts up the external access frequency by +1 and supplies data of the resulting external access frequency to the refresh control circuit 22. When supplied with the external access detection pulse ATD upon detection of the external access operation A, the refresh determination circuit 27 determines whether the access control circuit 26a is in an internal access operation state or in a refresh operation state.

According to the third embodiment, when the access control circuit 26a supplied with the external access detection pulse ATD is neither in an internal access operation state nor in a refresh operation state, the refresh determination circuit 27 steps up the determination signal RefE to a high level, in order to allow the access control circuit 26a to perform a refresh operation during the external access operation. When the access control circuit 26a supplied with the external access detection pulse ATD from the external access detection circuit 20a is either in an internal access operation state or in a refresh operation state, on the other hand, there is a high possibility that an internal access operation corresponding to a subsequent external access operation remarkably delays with respect to the external access operation if the ferroelectric memory performs a refresh operation during the external access operation. Therefore, the refresh determination circuit 27 steps down the refresh determination signal RefE to a low level so that the access control circuit 26a performs no refresh operation during the external access operation.

The access control circuit 26a is neither in an internal access operation state nor in a refresh operation state upon detection of the external access operation A, whereby the refresh determination circuit 27 steps up the refresh determination signal RefE to a high level. The refresh determination circuit 27 holds this refresh determination signal RefE at the high level until the external access detection circuit 20a detects the subsequent external access operation B.

When supplied with the external access detection pulse ATD upon detection of the external access operation A, the access control circuit 26a, neither in an internal access operation state nor in a refresh operation state, generates an internal clock ICLK1, having the cycle (60 nsec., for example) shorter than the shortest period (70 nsec., for example) of the external access operation, for one cycle with the internal clock generation circuit 25. Then, the access control circuit 26a performs an internal access operation A similar to that in the first embodiment in this cycle of the internal clock ICLK1.

Upon termination of the internal access operation A with termination of one cycle of the internal clock ICLK1, the refresh determination signal RefE is held at the high level. Further, the access control circuit 26a is supplied with the refresh request signal from the refresh control circuit 22. Thus, the access control circuit 26a generates an internal clock ICLK2 for a refresh operation for one cycle with the internal clock generation circuit 25 and supplies a refresh signal to the refresh control circuit 22. Consequently, the ferroelectric memory enters a refresh operation state. It is assumed that this is a 127th refresh operation after the supply of the refresh request signal. In other words, it is assumed that the word lines WL1 to WL126 have already been refreshed and the ferroelectric memory refreshes the word line WL127.

The refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation with respect to the word line WL127 to the refresh control circuit 22 supplied with the refresh signal. Therefore, the refresh control circuit 22 performs the read operation RFRD of the refresh operation with respect to the word line WL127. Thus, the ferroelectric memory outputs data of the memory cells 17 (see FIG. 2) linked to the word line WL127 to the latch train 14, which in turn holds the received data. Upon termination of the read operation RFRD with respect to the word line WL127, the access control circuit 26a enters a standby state up to initiation of a subsequent external access operation B.

Upon initiation of the subsequent external access operation B (see FIG. 10), the external access detection circuit 20a detects an external address signal. Thus, the external access detection circuit 20a generates an external access detection pulse ATD and supplies this external access detection pulse ATD to the access counter circuit 21a, the refresh determination circuit 27 and the access control circuit 26a. When supplied with the external access detection pulse ATD upon detection of the external access operation B, the access counter circuit 21a counts up the external access frequency by +1 and supplies data of the resulting external access frequency to the refresh control circuit 22. It is assumed that the external access detection circuit 20a has determined that the external access operation B is an operation for writing data in the memory cells 17 linked to the word line WL127.

When supplied with the external access detection pulse ATD upon detection of the external access operation B, the refresh determination circuit 27 determines whether the access control circuit 26a is in an internal access operation state or in a refresh operation state. The access control circuit 26a performs neither internal access operation nor refresh operation upon detection of the external access operation B, whereby the refresh determination circuit 27 holds the refresh determination signal RefE at the high level.

When supplied with the external access detection pulse ATD upon detection of the external access operation B, the access control circuit 26a, neither in an internal access operation state nor in a refresh operation state, generates an internal clock ICLK1 for one cycle with the internal clock generation circuit 25. Then, the access control circuit 26a performs the internal access operation B with respect to the word line WL127 in this cycle of the internal clock ICLK1. Therefore, data of the memory cells 17 linked to the word line WL127 is rewritten from data held in the latch train 14 through the read operation RFRD of the refresh operation. When the external access detection circuit 20a determines that the external access operation B is an operation for reading the data of the memory cells 17 linked to the word line WL127, the operation for reading the data of the memory cells 17 linked to the word line WL127 is performed after the data held in the latch train 14 is rewritten in the word line WL127. Thus, also when data "L" is written in the memory cells 17 storing data "H" due to destructive readout through the aforementioned read operation RFRD of the refresh operation with respect to the word line WL127, the data "H" held in the latch train 14 is rewritten in the memory cells 17 corresponding to the word line WL127 before a read operation corresponding to the external access operation B, thereby allowing suppression of readout in a state of replacing the data "H" in the memory cells 17 with the data "L" due to the destructive readout in a read operation corresponding to the external access operation B.

According to the third embodiment, a row address corresponding to the word line WL127 to be subjected to the external access operation B and a row address corresponding to the word line WL127 to be subjected to the read operation RFRD of the refresh operation coincide with each other, whereby the refresh control circuit 22 is supplied with an address determination signal AEQF of a high level from the address determination circuit 24. Thus, the refresh control circuit 22 counts up the refresh address signal by +1 without the first rewrite operation RFRS1. In other words, the refresh operation of the word line WL127 is terminated and is transferred to a refresh operation of the next word line WL128. The address determination signal AEQE is held at the high level until entering the refresh operation.

When terminating the internal access operation B with respect to the word line WL127, the access control circuit 26a supplied with the refresh request signal from the refresh control circuit 22 and supplied with the refresh determination signal RefE of the H level from the refresh determination circuit 27 generates an internal clock ICLK2 for performing a refresh operation after the internal access operation B and outputs a refresh signal to the refresh control circuit 22. Consequently, the ferroelectric memory enters a refresh operation state.

The refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation with respect to the next word line WL128 to the refresh control circuit 22 supplied with the refresh signal upon termination of the internal access operation B with respect to the word line WL127. Therefore, the refresh control circuit 22 performs the read operation RFRD of the refresh operation with respect to the word line WL128. Thus, the ferroelectric memory outputs data of the memory cells 17 linked to the word line WL128 to the latch train 14, which in turn holds the received data. Upon termination of the read operation RFRD with respect to the word line WL 128, the access control circuit 26a enters a standby state up to initiation of a subsequent external access operation C.

Upon initiation of the subsequent external access operation C (see FIG. 10), the external access detection circuit 20a detects an external address signal. Thus, the external access detection circuit 20a generates an external access detection pulse ATD and supplies this external access detection pulse ATD to the access counter circuit 21a, the refresh determination circuit 27 and the access control circuit 26a. When supplied with the external access detection pulse ATD upon detection of the external access operation C, the access counter circuit 21a counts up the external access frequency by +1 and supplies data of the resulting external access frequency to the refresh control circuit 22. It is assumed that an external access operation C is an operation for accessing the memory cells 17 linked to the word line WL other than the word line WL128.

When supplied with the external access detection pulse ATD upon detection of the external access operation C, the refresh determination circuit 27 determines whether the access control circuit 26a is in an internal access operation state or in a refresh operation state. The access control circuit 26a performs neither internal access operation nor refresh operation upon detection of the external access operation C, whereby the refresh determination circuit 27 holds the refresh determination signal RefE at the high level.

When supplied with the external access detection pulse ATD upon detection of the external access operation C, the access control circuit 26a, neither in an internal access operation state nor in a refresh operation state, generates an internal clock ICLK1 for one cycle with the internal clock generation circuit 25. Then, the access control circuit 26a performs the internal access operation C in this cycle of the internal clock ICLK1.

According to the third embodiment, a row address corresponding to the word line WL to be subjected to the external access operation C and a row address corresponding to the word line WL128 to be subjected to the read operation RFRD of the refresh operation do not coincide with each other, whereby the refresh control circuit 22 is supplied with an address determination signal AEQF of a low level from the address determination circuit 24. Thus, the refresh operation of the word line WL128 is continued without counting up the refresh address signal.

When terminating the internal access operation C, the access control circuit 26a supplied with the refresh request signal from the refresh control circuit 22 and supplied with the refresh determination signal RefE of the H level from the refresh determination circuit 27 generates an internal clock ICLK2 for performing a refresh operation after the internal access operation C and outputs a refresh signal to the refresh control circuit 22. Consequently, the ferroelectric memory enters a refresh operation state.

The refresh division control circuit 23 outputs a division signal requesting only the first rewrite operation RFRS1 forming the second cycle among the read operation RFRD, the first rewrite operation RFRS1 and the second rewrite operation RFRS2 forming the three cycles of the refresh operation with respect to the word line WL128 to the refresh control circuit 22 supplied with the refresh signal upon termination of the internal access operation C. Therefore, the refresh control circuit 22 performs the first rewrite operation RFRS1 of the refresh operation with respect to the word line WL128.

Upon initiation of the subsequent external access operation D (see FIG. 10), the external access detection circuit 20a detects an external address signal. Thus, the external access detection circuit 20a generates an external access detection pulse ATD and supplies this external access detection pulse ATD to the access counter circuit 21a, the refresh determination circuit 27 and the access control circuit 26a. When supplied with the external access detection pulse ATD upon detection of the external access operation D, the access counter circuit 21a counts up the external access frequency by +1 and supplies data of the resulting external access frequency to the refresh control circuit 22. It is assumed that an external access operation D is an operation for accessing the memory cells 17 linked to the word line WL other than the word line WL128.

When supplied with the external access detection pulse ATD upon detection of the external access operation D, the refresh determination circuit 27 determines whether the access control circuit 26a is in an internal access operation state or in a refresh operation state. The refresh control circuit 22 performs the first rewrite operation RFRS1 of the refresh operation upon detection of the external access operation D, whereby the refresh determination circuit 27 steps down the refresh determination signal RefE to a low level since the access control circuit 26a is in the refresh operation state.

The access control circuit 26a, supplied with the external access detection pulse ATD upon detection of the external access operation D, has not yet terminated the first rewrite operation RFRS1 of the refresh operation initiated in the period of the precedent external access operation C. Therefore, the access control circuit 26a generates no internal clock ICLK1, to perform no internal access operation D. Upon termination of the first rewrite operation RFRS1 initiated in the period of the external access operation C, the access control circuit 26a generates an internal clock ICLK1 for one cycle and initiates an internal access operation D. Then, the access control circuit 26a performs the internal access operation D in this cycle of the internal clock ICLK1. According to the third embodiment, the refresh determination signal RefE remains low upon termination of the internal access operation D with termination of one cycle of the internal clock ICLK1, whereby the access control circuit 26a enters a standby state up to the subsequent external access operation E without a refresh operation.

Upon initiation of the subsequent external access operation E (see FIG. 10), the external access detection circuit 20*a* detects an external address signal. Thus, the external access detection circuit 20*a* generates an external access detection pulse ATD and supplies this external access detection pulse ATD to the access counter circuit 21*a*, the refresh determination circuit 27 and the access control circuit 26*a*. When supplied with the external access detection pulse ATD upon detection of the external access operation E, the access counter circuit 21*a* counts up the external access frequency by +1 and supplies data of the resulting external access frequency to the refresh control circuit 22. It is assumed that the external access operation E is an operation for accessing the memory cells 17 linked to the word line WL other than the word line WL128.

When supplied with the external access detection pulse ATD upon detection of the external access operation E, the refresh determination circuit 27 determines whether the access control circuit 26*a* is in an internal access operation state or in a refresh operation state. The access control circuit 26*a* performs neither internal access operation nor refresh operation upon detection of the external access operation E, whereby the refresh determination circuit 27 steps up the refresh determination signal RefE to a high level.

When supplied with the external access detection pulse ATD upon detection of the external access operation E, the access control circuit 26*a*, neither in an internal access operation state nor in a refresh operation state, generates an internal clock ICLK1 for one cycle with the internal clock generation circuit 25. Then, the access control circuit 26*a* performs the internal access operation E in this cycle of the internal clock ICLK1.

According to the third embodiment, a row address corresponding each the word lines WL to be subjected to the external access operations D and E respectively and a row address corresponding to the word line WL128 to be subjected to the read operation RFRD of the refresh operation do not coincide with each other, whereby the refresh control circuit 22 is supplied with an address determination signal AEQF of a low level from the address determination circuit 24. Thus, the refresh operation of the word line WL128 is continued without counting up the refresh address signal.

When terminating the internal access operation E, the access control circuit 26*a* supplied with the refresh request signal from the refresh control circuit 22 and supplied with the refresh determination signal RefE of the H level from the refresh determination circuit 27 generates an internal clock ICLK2 for performing a refresh operation after the internal access operation E and outputs a refresh signal to the refresh control circuit 22. Consequently, the ferroelectric memory enters a refresh operation state.

The refresh division control circuit 23 outputs a division signal requesting only the second rewrite operation RFRS2 forming the third cycle among the read operation RFRD, the first rewrite operation RFRS1 and the second rewrite operation RFRS2 forming the three cycles of the refresh operation with respect to the word line WL128 to the refresh control circuit 22 supplied with the refresh signal upon termination of the internal access operation E. Therefore, the refresh control circuit 22 operates the second rewrite operation RFRS2 of the refresh operation with respect to the word line WL128. Upon termination of the second rewrite operation RFRS2 with respect to the word line WL128, the access control circuit 26*a* enters a standby state up to initiation of a subsequent external access operation.

Thereafter the ferroelectric memory repeats only the internal access operation without performing the refresh operation. When external access operations are performed by a prescribed frequency ($10^6$ times, for example) from initiation of the refresh operation responsive to the precedent refresh request signal, the refresh control circuit 22 supplies a refresh request signal to the access control circuit 26*a* on the basis of the external access frequency supplied by the access counter circuit 21*a*. Then, the ferroelectric memory performs a refresh operation divided into three cycles on all word lines WL1 to WL128 again.

According to the third embodiment, as hereinabove described, the refresh determination circuit 27, provided on the memory for determining whether or not to perform the refresh operation on the basis of detection of the external access operation by the external access detection circuit 20*a* and the operating state of the access control circuit 26*a*, can determine with the refresh determination circuit 27 whether or not to perform the refresh operation on the basis of the operating state of the access control circuit 26*a* upon the external access operation also when the external access operation is not periodically performed. Therefore, the memory can perform the divided refresh operation uncompetitively with the internal access operation on the basis of the determination of the refresh determination circuit 27 with the access control circuit 26*a* not only when the memory is subjected to a periodically performed external access operation but also when the memory is subjected to an aperiodically performed external access operation.

According to the third embodiment, the access control circuit 26*a*, having terminated the internal access operation corresponding to the precedent external access operation and the refresh operation upon detection of the external access operation when performing neither internal access operation nor refresh operation upon detection of the external access operation, can perform the corresponding internal access operation substantially simultaneously with detection of the external access operation. Thus, the ferroelectric memory can suppress a possibility of continuing any refresh operation until after initiation of a subsequent external access operation.

The remaining effects of the third embodiment are similar to those of the aforementioned first embodiment.

Fourth Embodiment

Figure 11:
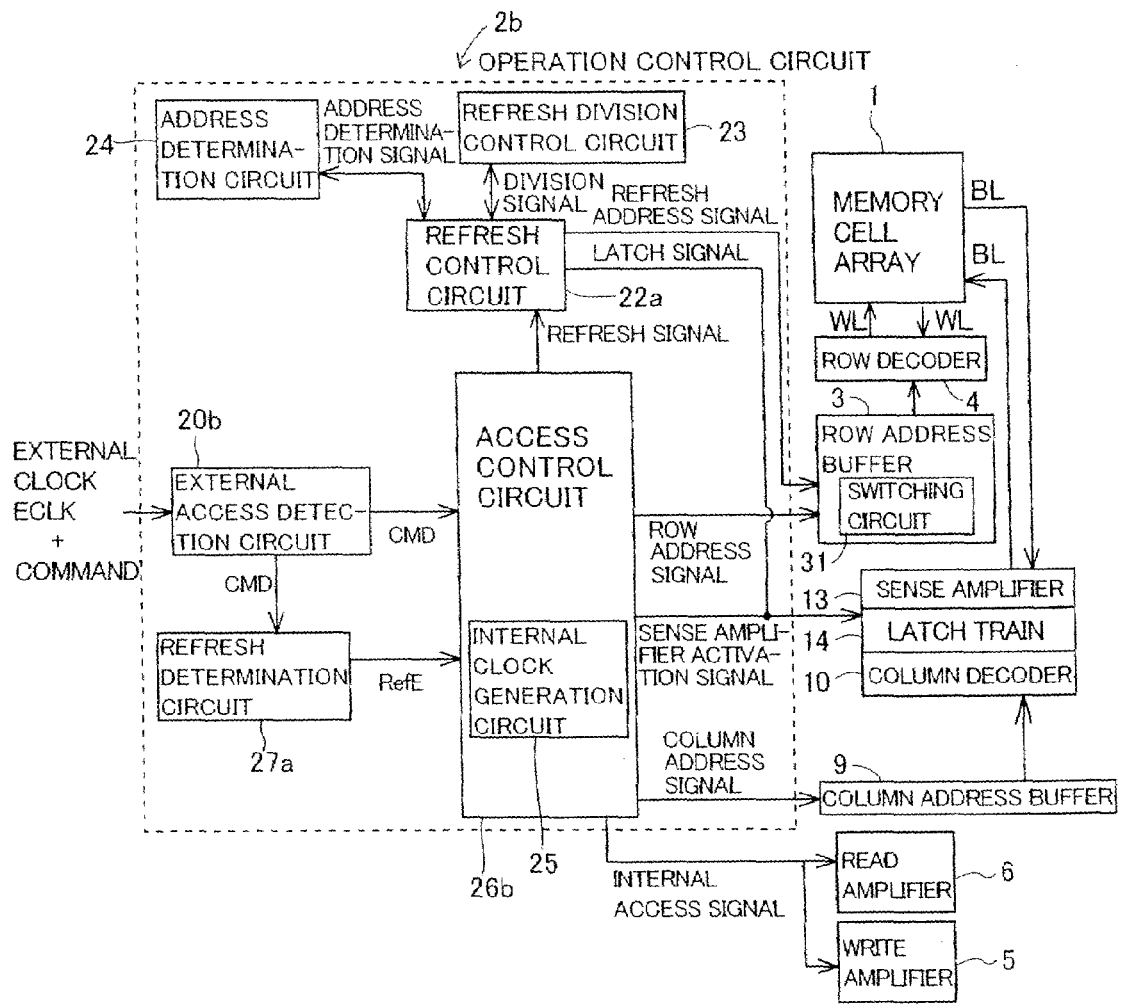
FIG. 11 is a block diagram for illustrating the structure of an operation control circuit of a simple matrix ferroelectric memory according to a fourth embodiment of the present invention.

Referring to FIG. 11, a fourth embodiment of the present invention is applied to a simple matrix ferroelectric memory subjected to a refresh operation independently of an external access frequency, dissimilarly to the aforementioned first embodiment.

In the ferroelectric memory according to the fourth embodiment, an operation control circuit 2*b* includes an external access detection circuit 20*b*, a refresh control circuit 22*a*, a refresh division control circuit 23, an address determination circuit 24, an access control circuit 26*b* having an internal clock generation circuit 25 and a refresh determination circuit 27*a*, as shown in FIG. 11. The external access detection circuit 20*b* and the refresh determination circuit 27*a* are examples of the "external access detection portion" and the "refresh control portion" in the present invention respectively. The refresh control circuit 22*a* is examples of the "refresh control portion" and the "refresh control means" in the present invention, and the access control circuit 26*b* is examples of the "access control portion" and the "access control means" in the present invention. The external access detection circuit 20*b* has a function of outputting an external access detection pulse CMD to the access control circuit 26*b* and the refresh determination circuit 27*a* when supplied with an external clock ECLK for an external access operation.

The access control circuit 26b, receiving a refresh determination signal RefE from the refresh determination circuit 27a, has a function of generating an internal clock ICLK2 for a refresh operation with the internal clock generation circuit 25 when performing the refresh operation after terminating an internal access operation. As to the remaining functions, the external access detection circuit 20b and the access control circuit 26b are similar to the external access detection circuit 20 and the access control circuit 26 according to the first embodiment, respectively. According to the fourth embodiment, the access control circuit 26b receives no refresh request signal from the refresh control circuit 22a, dissimilarly to the first embodiment. When supplied with the external access detection pulse CMD from the external access detection circuit 20b upon detection of the corresponding external access operation, the refresh determination circuit 27a outputs the refresh determination signal RefE of a high or low level on the basis of the operating state of the access control circuit 26b. The refresh division control circuit 23 and the address determination circuit 24 are similar in structure to those according to the first embodiment.

The remaining structure of the fourth embodiment is similar to that of the aforementioned first embodiment.

Operations of the simple matrix ferroelectric memory according to the fourth embodiment of the present invention will be now described with reference to FIGS. 2, 11 and 12.

Figure 12:
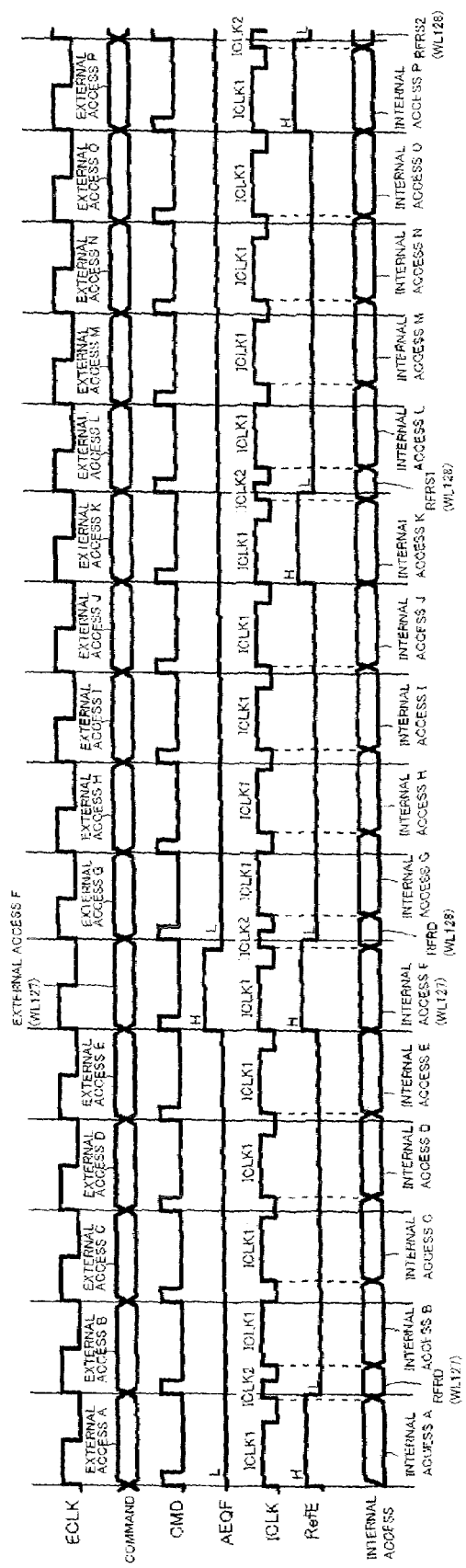
FIG. 12 is a voltage waveform diagram for illustrating operations of the simple matrix ferroelectric memory according to the fourth embodiment of the present invention.

When detecting an external clock ECLK for an external access operation A, the external access detection circuit 20b generates an external access detection pulse CMD and supplies this external access detection pulse CMD to the access control circuit 26b and the refresh determination circuit 27a, as shown in FIGS. 11 and 12. When supplied with the external access detection pulse CMD upon detection of the external access operation A, the refresh determination circuit 27a determines whether the access control circuit 26b is in an internal access operation state or in a refresh operation state.

The access control circuit 26b is neither in an internal access operation state nor in a refresh operation state upon detection of the external access operation A, whereby the refresh determination circuit 27a steps up the refresh determination signal RefE to a high level. The refresh determination circuit 27a holds the refresh determination signal RefE at the high level until the external access detection circuit 20b detects a subsequent external access operation B.

When supplied with the external access detection pulse CMD upon detection of the external access operation A, the access control circuit 26b, neither in an internal access operation state nor in a refresh operation state, generates an internal clock ICLK1 having a cycle (64 nsec., for example) shorter than the cycle (60 nsec., for example) of the external access operation for one cycle with the internal clock generation circuit 25. Then, the access control circuit 26b performs an internal access operation A similar to that in the first embodiment in this cycle of the internal clock ICLK1.

Upon termination of the internal access operation A with termination of one cycle of the internal clock ICLK1, the refresh determination signal RefE is held at the high level. Therefore, the access control circuit 26b generates an internal clock ICLK2 for a refresh operation for one cycle with the internal clock generation circuit 25 and supplies a refresh signal to the refresh control circuit 22a. Consequently, the ferroelectric memory enters a refresh operation state. It is assumed that the word line WL127 is refreshed in this refresh operation.

The refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation with respect to the word line WL 127 to the refresh control circuit 22a supplied with the refresh signal. Therefore, the refresh control circuit 22a outputs a refresh address signal including a row address corresponding to the word line WL127 to the row address buffer 3, in order to perform the read operation RFRD of the refresh operation. Thus, the ferroelectric memory outputs data of the memory cells 17 (see FIG. 2) linked to the word line WL127 to the latch train 14, which in turn holds the received data.

Upon initiation of the external access operation B (see FIG. 12), the external access detection circuit 20b detects an external clock ECLK. Thus, the external access detection circuit 20b generates an external access detection pulse CMD and supplies this external access detection pulse CMD to the access control circuit 26b and the refresh determination circuit 27a. When supplied with the external access detection pulse CMD upon detection of the external access operation B, the refresh determination circuit 27a determines whether the access control circuit 26b is in an internal access state or in a refresh operation state. The access control circuit 26b performs the read operation RFRD of the refresh operation upon detection of the external access operation B, whereby the refresh determination circuit 27a steps down the refresh determination signal RefE to a low level. It is assumed that the external access operation B is an operation for accessing the memory cells 17 linked to the word line WL other than the word line WL127.

The access control circuit 26b, supplied with the external access detection pulse CMD upon detection of the external access operation B, has not yet terminated the read operation RFRD of the refresh operation initiated in the period of the precedent external access operation A. Therefore, the access control circuit 26b generates no internal clock ICLK1, to perform no internal access operation B. Upon termination of the read operation RFRD initiated in the period of external access operation A, the access control circuit 26b generates an internal clock ICLK1 for one cycle with the internal clock generation circuit 25 and initiates an internal access operation B. Then, the access control circuit 26b performs the internal access operation B in this cycle of the internal clock ICLK1. According to the fourth embodiment, a row address corresponding to the word line WL to be subjected to the external access operation B and the row address corresponding to the word line WL127 to be subjected to the read operation RFRD of the refresh operation do not coincide with each other, whereby an address determination signal AEQF is held at the low level. The refresh operation is not performed after the internal access operation B since the refresh determination signal RefE is at the low level.

Upon initiation of a subsequent external access operation C (see FIG. 12), the external access detection circuit 20b detects an external clock ECLK. Thus, the external access detection circuit 20b generates an external access detection pulse CMD and supplies this external access detection pulse CMD to the access control circuit 26b and the refresh determination circuit 27a. When supplied with the external access detection pulse CMD upon detection of the external access operation C, the refresh determination circuit 27a determines whether the access control circuit 26b is in an internal access state or in a refresh operation state. The access control circuit 26b performs the internal access operation B upon detection of the external access operation C, whereby the refresh determination circuit 27a holds the refresh determination signal RefE at the low level. It is assumed that the external access operation C is an operation for accessing the memory cells 17 linked to the word line WL other than the word line WL127.

The access control circuit 26b, supplied with the external access detection pulse CMD upon detection of the external access operation C, has not yet terminated the internal access operation B. Therefore, the access control circuit 26b generates no internal clock ICLK1, to perform no internal access operation C. Upon termination of the internal access operation B, the access control circuit 26b generates an internal clock ICLK1 for one cycle with the internal clock generation circuit 25 and initiates an internal access operation C. Then, the access control circuit 26b performs the internal access operation C in this cycle of the internal clock ICLK1. According to the fourth embodiment, the row address corresponding to the word line WL to be subjected to the external access operation B and the row address corresponding to the word line WL127 to be subjected to the read operation RFRD of the refresh operation do not coincide with each other, whereby the address determination signal AEQF is held at the low level. The refresh operation is not performed after the internal access operation C since the refresh determination signal RefE is at the low level.

Internal access operations D and E are performed in external access operations D and E (see FIG. 12) respectively, similarly to the case of the aforementioned external access operation C. The external access operations D and E are operations for accessing the memory cells 17 linked to the word lines WL other than the word line WL127 respectively. According to the fourth embodiment, a row address corresponding to each word line to be subjected to the external access operations D and E and the row address corresponding to the word line WL127 to be subjected to the read operation RFRD of the refresh operation do not coincide with each other, whereby the address determination signal AEQF is held at the low level.

Upon initiation of a subsequent external access operation F (see FIG. 12), the external access detection circuit 20b detects an external clock ECLK. Thus, the external access detection circuit 20b generates an external access detection pulse CMD and supplies this external access detection pulse CMD to the access control circuit 26b and the refresh determination circuit 27a. When supplied with the external access detection pulse CMD upon detection of the external access operation F, the refresh determination circuit 27a determines whether the access control circuit 26b is in an internal access state or in a refresh operation state. The access control circuit 26b is neither in an internal access operation state nor in a refresh operation state upon detection of the external access operation F, whereby the refresh determination circuit 27a steps up the refresh determination signal RefE to a high level. The refresh determination circuit 27a holds this refresh determination signal RefE at the high level until the external access detection circuit 20b detects the subsequent external access operation G. It is assumed that the external access detection circuit 20b has determined that this external access operation F is an operation for writing data in the memory cells 17 linked to the word line WL127.

When supplied with the external access detection pulse CMD upon detection of the external access operation F with respect to the word line WL127, the access control circuit 26b, neither in an internal access operation state nor in a refresh operation state, generates an internal clock ICLK1 with the internal clock generation circuit 25. Then, the access control circuit 26b performs the internal access operation F with respect to the word line WL127 in this cycle of the internal clock ICLK1. Therefore, data of the memory cells 17 linked to the word line WL127 is placed from data held in the latch train 14 through the read operation RFRD of the refresh operation. When the external access detection circuit 20b determines that the external access operation F is an operation for reading the data of the memory cells 17 linked to the word line WL127, the operation for reading the data of the memory cells 17 linked to the word line WL127 is performed after the data held in the latch train 14 is rewritten in the word line WL127. Thus, also when data "L" is written in the memory cells 17 storing data "H" due to destructive readout through the aforementioned read operation RFRD of the refresh operation with respect to the word line WL127, the data "H" held in the latch train 14 is rewritten in the memory cells 17 corresponding to the word line WL127 before a read operation corresponding to the external access operation F, thereby allowing suppression of readout in a state of replacing the data "H" in the memory cells 17 with the data "L" due to the destructive readout in a read operation corresponding to the external access operation F.

According to the fourth embodiment, the row address corresponding to the word line WL127 to be subjected to the external access operation F and the row address corresponding to the word line WL127 to be subjected to the read operation RFRD of the refresh operation coincide with each other, whereby the refresh control circuit 22a is supplied with an address determination signal AEQF of a high level from the address determination circuit 24. Thus, the refresh control circuit 22a counts up the refresh address signal by +1 without the first rewrite operation RFRS1. In other words, the refresh operation of the word line WL127 is terminated and is transferred to a refresh operation of the next word line WL128. This address determination signal AEQF is held at the high level until entering the refresh state.

When terminating the internal access operation F, the access control circuit 26a supplied with the refresh determination signal RefE of the high level from the refresh determination circuit 27a generates an internal clock ICLK2 for performing a refresh operation after the internal access operation F and outputs a refresh signal to the refresh control circuit 22a. Consequently, the ferroelectric memory enters a refresh operation state.

The refresh division control circuit 23 outputs a division signal requesting only the read operation RFRD forming the first cycle among the read operation RFRD, the first rewrite operation RFRS1 and the second rewrite operation RFRS2 forming the three cycles of the refresh operation with respect to the next word line WL128 to the refresh control circuit 22a supplied with the refresh signal upon termination of the internal access operation F with respect to the word line WL127. Therefore, the refresh control circuit 22a outputs a refresh address signal including a row address corresponding to the word line WL128 to the row address buffer 3, in order to perform the read operation RFRD of the refresh operation. Thus, the ferroelectric memory outputs data of the memory cells 17 linked to the word line WL128 to the latch train 14, which in turn holds the received data.

Internal access operations G to J are performed in external access operations G to J (see FIG. 12) similarly to the cases of the aforementioned external access operations B to E. The external access operations G to J are operations for accessing the memory cells 17 linked to the word line WL other than the word line WL128.

Upon initiation of the external access operation K (see FIG. 12), the external access detection circuit 20b detects an external clock ECLK. Thus, the external access detection circuit 20b generates an external access detection pulse CMD and supplies this external access detection pulse CMD to the access control circuit 26b and the refresh determination circuit 27a. When supplied with the external access detection pulse CMD upon detection of the external access operation K, the refresh determination circuit 27a determines whether the access control circuit 26b is in an internal access state or in a refresh operation state. The access control circuit 26b is neither in an internal access operation state nor in a refresh operation state upon detection of the external access operation K, whereby the refresh determination circuit 27a steps up the refresh determination signal RefE to a high level. The refresh determination circuit 20b holds this refresh determination signal RefE at the high level until the external access detection circuit 20b detects a subsequent external access operation L. It is assumed that the external access operation K is an operation for accessing the memory cells 17 linked to the word line WL other than the word line WL128.

When supplied with the external access detection pulse CMD upon detection of the external access operation K, the access control circuit 26b, neither in an internal access operation state nor in a refresh operation state, generates an internal clock ICLK1 for one cycle with the internal clock generation circuit 25. Then, the access control circuit 26b performs the internal access operation K in this cycle of the internal clock ICLK1.

According to the fourth embodiment, a row address corresponding to each word line to be subjected to the external access operations G to K and the row address corresponding to the word line WL 128 to be subjected to the read operation RFRD of the refresh operation do not coincide with each other, whereby the refresh control circuit 22a is supplied with the address determination signal AEQF of the low level from the address determination circuit 24. Therefore, the refresh address signal is not counted up and the refresh operation of the word line WL128 is continued.

Upon termination of the internal access operation K with termination of one cycle of the internal clock ICLK1, the refresh determination signal RefE is held at the high level. Thus, the access control circuit 26b generates an internal clock ICLK2 for a refresh operation for one cycle with the internal clock generation circuit 25 and supplies a refresh signal to the refresh control circuit 22a. Consequently, the ferroelectric memory enters a refresh operation state.

The refresh division control circuit 23 outputs a division signal requesting only the first rewrite operation RFRS1 forming the second cycle among the read operation RFRD, the first rewrite operation RFRS1 and the second rewrite operation RFRS2 forming the three cycles of the refresh operation with respect to the word line WL128 to the refresh control circuit 22a supplied with the refresh signal upon termination of the internal access operation K. Therefore, the refresh control circuit 22a performs the first rewrite operation RFRS1 of the refresh operation with respect to the word line WL128.

Internal access operations L to O are performed in external access operations L to O (see FIG. 12) respectively, similarly to the cases of the aforementioned external access operations B to E. The external access operations L to O are operations for accessing the memory cells 17 linked to the word line WL other than the word line WL128.

Upon initiation of the external access operation P (see FIG. 12), the external access detection circuit 20b detects an external clock ECLK. Thus, the external access detection circuit 20b generates an external access detection pulse CMD and supplies this external access detection pulse CMD to the access control circuit 26b and the refresh determination circuit 27a. When supplied with the external access detection pulse CMD upon detection of the external access operation P, the refresh determination circuit 27a determines whether the access control circuit 26b is in an internal access state or in a refresh operation state. The access control circuit 26b is neither in an internal access operation state nor in a refresh operation state upon detection of the external access operation P, whereby the refresh determination circuit 27a steps up the refresh determination signal RefE to a high level. The refresh determination circuit 20b holds this refresh determination signal RefE at the high level until the external access detection circuit 20b detects the subsequent external access operation. It is assumed that the external access operation P is an operation for accessing the memory cells 17 linked to the word line WL other than the word line WL128.

When supplied with the external access detection pulse CMD upon detection of the external access operation P, the access control circuit 26b, neither in an internal access operation state nor in a refresh operation state, generates an internal clock ICLK1 for one cycle with the internal clock generation circuit 25. Then, the access control circuit 26b performs the internal access operation P in this cycle of the internal clock ICLK1.

According to the fourth embodiment, a row address corresponding to each word line to be subjected to the external access operations L to P and the row address corresponding to the word line WL 128 to be subjected to the read operation RFRD of the refresh operation do not coincide with each other, whereby the refresh control circuit 22a is supplied with the address determination signal AEQF of the low level from the address determination circuit 24. Therefore, the refresh address signal is not counted up and the refresh operation of the word line WL128 is continued.

Upon termination of the internal access operation P with termination of one cycle of the internal clock ICLK1, the refresh determination signal RefE is held at the high level. Thus, the access control circuit 26b generates an internal clock ICLK2 for a refresh operation for one cycle and supplies a refresh signal to the refresh control circuit 22a. Consequently, the ferroelectric memory enters a refresh operation state.

The refresh division control circuit 23 outputs a division signal requesting only the second rewrite operation RFRS2 forming the third cycle among the read operation RFRD, the first rewrite operation RFRS1 and the second rewrite operation RFRS2 forming the three cycles of the refresh operation with respect to the word line WL128 to the refresh control circuit 22a supplied with the refresh signal upon termination of the internal access operation P. Therefore, the refresh control circuit 22a performs the second rewrite operation RFRS2 of the refresh operation with respect to the word line WL128.

Thus, the ferroelectric memory performs a refresh operation divided into three cycles in order from word line WL1 again after performing the refresh operation with respect to the word line WL128.

According to the fourth embodiment, as hereinabove described, the ferroelectric memory performs the divided refresh operation every five external access operations without outputting a refresh request signal, thereby further suppressing data destruction resulting from disturbance. Further, the memory may not be provided with the access counter circuit 21 (see FIG. 3) counting the access frequency of the external access operation, whereby the circuit structure of the memory can be simplified.

The remaining effects of the fourth embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the ferroelectric memory is provided with the address determination circuit supplying the address determination signal AEQF of the high level to the refresh control circuit when the word line WL to be subjected to the refresh operation and the word line WL to be subjected to the external access operation performed during the refresh operation coincide with each other in each of the aforementioned first to fourth embodiments, the present invention is not restricted to this but the ferroelectric memory may alternatively provided with an address determination circuit supplying the address determination signal AEQF of the high level to the refresh control circuit when the word line WL to be subjected to the refresh operation and the word line WL to be subjected to the external access operation performed during the refresh operation coincide with each other and the external access operation is an write operation.

While the refresh control circuit 22 and the address determination circuit 24 are separately provided from each other in each of the aforementioned first to fourth embodiments, the present invention is not restricted to this but the ferroelectric memory may alternatively provided with a refresh control circuit including an address determination circuit.

While the refresh control circuit counts up the refresh address signal by +1 without the first and second rewrite operations RFRS1 and RFRS2 when the address determination signal AEQF of the high level is supplied from the address determination circuit to the refresh control circuit after performing the read operation RFRD of the refresh operation in each of the aforementioned first, third and fourth embodiments, the present invention is not restricted to this but the refresh control circuit may alternatively count up the refresh address signal by +1 without the second rewrite operation RFRS2 when the address determination signal AEQF of the high level is supplied from the address determination circuit to the refresh control circuit after the first rewrite operation RFRS1 of the refresh operation is performed. According to this structure, data written through the write operation of the external access operation can be inhibited from being disadvantageously partially replaced with precedent old data in the read operation RFRD of the refresh operation through the second rewrite operation RFRS2 of the refresh operation.

While the ferroelectric memory performs the refresh operation after terminating the internal access operation in each of the aforementioned first to fourth embodiments, the present invention is not restricted to this but the ferroelectric memory may alternatively perform the refresh operation before the internal access operation. Further alternatively, the ferroelectric memory may perform the refresh operation before the internal access operation, may perform the refresh operation after the internal access operation, and may perform the refresh operation before and after the internal access operation.

While the ferroelectric memory is supplied with the external address signal for the external access operation in each of the aforementioned first to fourth embodiments, the present invention is not restricted to this but is also applicable to a memory having an external access detection circuit supplied with data other than an external address signal as a command for an external access operation.

While the ferroelectric memory collectively refreshes all memory cells linked to the selected word line WL in each of the aforementioned first to fourth embodiments, the present invention is not restricted to this but is also applicable to a case of refreshing every prescribed memory cell arranged on a position where a prescribed word line WL and a prescribed bit line BL intersect with each other. In this case, the address determination circuit further determines whether not only row addresses but also column addresses coincide with each other.

While the simple matrix ferroelectric memory includes the memory cells formed by the word lines WL, the bit lines BL and the ferroelectric films arranged between the word lines WL and the bit lines BL in each of the aforementioned first to fourth embodiments, the present invention is not restricted to this but is also applicable to a one-transistor ferroelectric memory causing disturbance. The present invention is further applicable to a memory, such as a DRAM requiring refreshment, other than the ferroelectric memory.

While the ferroelectric memory performs the divided refresh operation every five external access operations in the aforementioned fourth embodiment, the present invention is not restricted to this but the ferroelectric memory may alternatively perform the divided refresh operation every time the external access operation is performed a prescribed number of times. For example, the ferroelectric memory may perform the divided refresh operation every six or four external access operations.

While the address determination signal AEQF of the high level is supplied from the address determination circuit to the refresh control circuit when the row address corresponding to the word line WL to be subjected to the external access operation F and the row address corresponding to the word line WL to be subjected to the read operation RFRD of the refresh operation coincide with each other and the row address corresponding to each word line WL to be subjected to external access operations B to E and the row address corresponding to the word line WL to be subjected to the read operation RFRD of the refresh operation do not coincide with each other in the aforementioned fourth embodiment, the present invention is not restricted to this but the address determination signal AEQF of the high level may be alternatively supplied from the address determination circuit to the refresh control circuit when the row address corresponding to the word line WL to be subjected to at least one of the external access operations B to F and the row address corresponding to the word line WL to be subjected to the read operation RFRD of the refresh operation coincide with each other.

What is claimed is:

1. A memory comprising:
    an access control portion performing an internal access operation on the basis of an external access operation;
    a refresh control portion performing a refresh operation;
    a refresh division control portion dividing said refresh operation into a read operation and a rewrite operation; and
    an address determination portion determining whether or not an address to be subjected to said refresh operation and an address to be subjected to said external access operation during said refresh operation coincide with each other.

2. The memory according to claim 1, wherein
    said refresh control portion controls whether or not to perform said rewrite operation of said refresh operation on the basis of the output of said address determination portion.

3. The memory according to claim 2, wherein
    when said address determination portion determines that said address to be subjected to said refresh operation and said address to be subjected to said external access operation during said refresh operation coincide with each other, said refresh control portion terminates said refresh operation without said rewrite operation of said refresh operation with respect to coincident said address.

4. The memory according to claim 2, wherein
said refresh control portion performs said rewrite operation of said refresh operation when said address determination portion determines that said address to be subjected to said refresh operation and said address to be subjected to said external access operation during said refresh operation do not coincide with each other.

5. The memory according to claim 1, further comprising a latch portion holding data read by said read operation of said refresh operation, wherein
said refresh control portion controls whether or not to replace data held in said latch portion with data written by said external access operation on the basis of the output of said address determination portion.

6. The memory according to claim 5, wherein
when said address determination portion determines that said address to be subjected to said refresh operation and said address to be subjected to said external access operation during said refresh operation coincide with each other, said refresh control portion replaces said data held in said latch portion with said data written by said external access operation and performs said rewrite operation of said refresh operation with respect to coincident said address.

7. The memory according to claim 5, wherein
when said address determination portion determines that said address to be subjected to said refresh operation and said address to be subjected to said external access operation during said refresh operation do not coincide with each other, said refresh control portion performs said rewrite operation of said refresh operation without replacing said data held in said latch portion with said data written by said external access operation.

8. The memory according to claim 1, wherein
said refresh division control portion divides said rewrite operation into a first rewrite operation and a second rewrite operation, and
the memory performs said read operation, said first rewrite operation and said second rewrite operation at least either before or after different said internal access operations corresponding to different said external access operations respectively.

9. The memory according to claim 1, further comprising:
an external access detection portion detecting said external access operation; and
a refresh determination portion determining whether or not to perform said refresh operation on the basis of detection of said external access operation by said external access detection portion and the operating state of said access control portion, wherein
said access control portion performs said refresh operation at least either before or after said internal access operation on the basis of the result of determination of said refresh determination portion.

10. The memory according to claim 9, wherein
said refresh determination portion outputs a signal for said refresh operation if said access control portion performs neither said internal access operation nor said refresh operation when said external access detection portion detects said external access operation.

11. The memory according to claim 9, wherein
said refresh determination portion outputs a signal controlling so as not to perform said refresh operation if performing said internal access operation or said refresh operation when said external access detection portion detects said external access operation.

12. The memory according to claim 1, further comprising an external access counter portion counting the access frequency of said external access operation, wherein
said access control portion performs said refresh operation on the basis of said access frequency counted by said external access counter portion.

13. The memory according to claim 1, performing said refresh operation regardless of the access frequency of said external access operation.

14. The memory according to claim 1, further comprising a memory cell consisting of a ferroelectric capacitor, and
performing said refresh operation with respect to said memory cell consisting of said ferroelectric capacitor.

15. The memory according to claim 1, wherein
said access control portion includes an internal clock generation portion generating an internal clock for said internal access operation and an internal clock for said refresh operation.

16. The memory according to claim 1, further comprising:
a word line and a bit line arranged to intersect with each other; and
a memory cell arranged on the intersectional position between said word line and said bit line, and
collectively performing said refresh operation on said memory cell linked to said word line every said word line.

17. The memory according to claim 1, further comprising a switching portion switching a row address signal corresponding to an internal address signal for said internal access operation and another row address signal corresponding to a refresh address signal for said refresh operation.

18. The memory according to claim 1, wherein
said external access operation includes a write operation, and
said refresh control portion controls whether or not to perform said rewrite operation of said refresh operation on the basis of the output of said address determination portion when said external access operation is said write operation.

19. The memory according to claim 1, performing said read operation and said rewrite operation of said refresh operation after different said internal access operations corresponding to different said external access operations respectively.

20. A memory comprising:
access control means performing an internal access operation on the basis of an external access operation;
refresh control means performing an refresh operation;
refresh division control means dividing said refresh operation into a read operation and a rewrite operation; and
address determination means determining whether or not an address to be subjected to said refresh operation and an address to be subjected to said external access operation during said refresh operation coincide with each other.

* * * * *